(12) United States Patent  
Saitoh et al.

(10) Patent No.: US 7,740,958 B2
(45) Date of Patent: Jun. 22, 2010

(54) ORGANIC LIGHT-EMITTING DEVICE

(75) Inventors: Akihito Saitoh, Yokohama (JP); Masataka Yashima, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 667 days.

(21) Appl. No.: 11/678,367

(22) Filed: Feb. 23, 2007

(65) Prior Publication Data
US 2007/0207346 A1   Sep. 6, 2007

(30) Foreign Application Priority Data
Mar. 2, 2006   (JP)   ............... 2006-056957

(51) Int. Cl.
*H01L 51/54* (2006.01)
(52) U.S. Cl. .............. 428/690; 428/917; 313/504; 313/506
(58) Field of Classification Search .......... None
See application file for complete search history.

(56) References Cited

U.S. PATENT DOCUMENTS

| | | | | |
|---|---|---|---|---|
| 5,187,310 | A | 2/1993 | Mishima et al. | 556/413 |
| 5,352,554 | A | 10/1994 | Mishima et al. | 430/59 |
| 6,713,192 | B2 | 3/2004 | Fukuoka et al. | 428/690 |
| 7,173,131 | B2 | 2/2007 | Saitoh et al. | 544/336 |
| 7,229,702 | B2 * | 6/2007 | Saitoh et al. | 428/690 |
| 7,365,198 | B2 * | 4/2008 | Saitoh et al. | 544/229 |
| 2006/0166034 | A1 | 7/2006 | Saitoh et al. | 428/690 |

FOREIGN PATENT DOCUMENTS

| JP | 03-271296 | 12/1991 |
|---|---|---|
| JP | 2001-284050 | 10/2001 |
| WO | WO 03/080559 A1 * | 10/2003 |
| WO | WO 2004/020387 A1 * | 3/2004 |

OTHER PUBLICATIONS

Kyushin et al., "Synthesis and Electronic Properties of 9,10-Disilylanthracenes," *Organometallics*, vol. 15, 1067-1070 (1996).

* cited by examiner

*Primary Examiner*—Dawn L. Garrett
(74) *Attorney, Agent, or Firm*—Fitzpatrick, Cella, Harper & Scinto

(57) ABSTRACT

Provided is an organic light-emitting device capable of emitting light with high efficiency by incorporating a silyl compound in which a silyl group and an amino group are directly bonded to an anthracene ring particularly into its light-emitting layer. In the organic light-emitting device including: a pair of electrodes composed of an anode and a cathode; and an organic compound layer interposed between the pair of electrodes, wherein the organic compound layer contains the following silyl compound. A layer containing at least one kind of the silyl compound is a light-emitting layer.

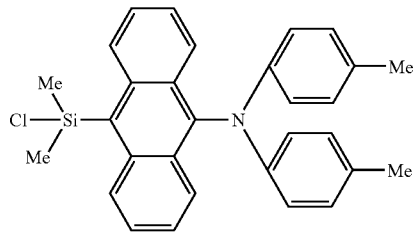

5 Claims, 2 Drawing Sheets

ORGANIC LIGHT-EMITTING DEVICE

BACKGROUND OF THE INVENTION

1. Field of the Invention

The present invention relates to an organic light-emitting device using a compound including an anthracene ring having at least a silyl group and an amino group directly bonded thereto as substituents.

2. Description of the Related Art

An organic light-emitting device is a device which includes a thin film containing a fluorescent organic compound between an anode and a cathode, which generates an exciton from the fluorescent compound by injection of an electron and a hole from each electrode, and which utilizes light to be radiated when the exciton returns to a ground state.

Japanese Patent Application Laid-Open No. 2001-284050 discloses a device containing an anthracene derivative with a specific structure, an electron-transporting compound, and another fluorescent compound in a light-emitting medium layer. Thereby it provides a red light-emitting device with improved reliability. However, the device has insufficient luminous efficiency for practical use.

Japanese Patent Application Laid-Open No. H03-271296 discloses an anthracene compound having a diarylamino group and a silyl group as a charge transport material in an electrophotographic photosensitive member. However, it has no description concerning the application of the compound to an organic light-emitting device.

SUMMARY OF THE INVENTION

The present invention has been made in view of solving conventional problems in the prior art. An object of the present invention is therefore to provide an organic light-emitting device for exhibiting an optical output with high efficiency, high luminance, and long life. In addition, another object of the present invention is to provide an organic light-emitting device which can be easily produced at relatively low cost.

The inventors of the present invention have conducted extensive studies for attaining the above-mentioned objects, and have completed the present invention.

According to the present invention, there is provided an organic light-emitting device including: a pair of electrodes composed of an anode and a cathode; and an organic compound layer interposed between the pair of electrodes, in which the organic compound layer contains a compound represented by the following general formula [1]:

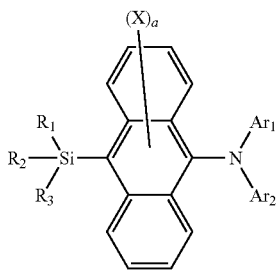

[1]

wherein $Ar_1$ and $Ar_2$ each represent a group selected from the group consisting of a substituted or unsubstituted alkyl group, a substituted or unsubstituted aralkyl group, a substituted or unsubstituted aryl group, and a substituted or unsubstituted heterocyclic group, $Ar_1$ and $Ar_2$ may be the same or different from each other, and $Ar_1$ and $Ar_2$ may be bonded to each other to form a ring; $R_1$, $R_2$, and $R_3$ each represent a group selected from the group consisting of a hydrogen atom, a halogen atom, a substituted or unsubstituted alkyl group, a substituted or unsubstituted aralkyl group, a substituted or unsubstituted aryl group, and a substituted or unsubstituted heterocyclic group, and $R_1$, $R_2$, and $R_3$ may be the same or different from one another; X represents a group selected from the group consisting of a halogen atom, a substituted or unsubstituted alkyl group, a substituted or unsubstituted aralkyl group, a substituted or unsubstituted alkenyl group, a substituted or unsubstituted alkynyl group, a substituted or unsubstituted alkoxy group, a substituted or unsubstituted sulfide group, a substituted or unsubstituted silyl group, a substituted or unsubstituted amino group, a substituted or unsubstituted aryl group, and a substituted or unsubstituted heterocyclic group, and X's may be the same or different from each other; and a represents an integer of 0 or more to 8 or less.

The organic compound layer preferably constitutes a light-emitting layer.

The light-emitting layer preferably contains a first compound represented by the general formula [1] and a second compound represented by the following general formula [2]:

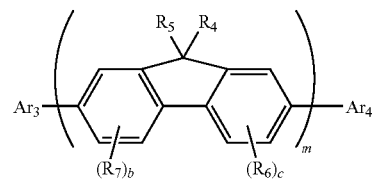

[2]

wherein $R_4$ and $R_5$ each represent a hydrogen atom, a substituted or unsubstituted alkyl group, a substituted or unsubstituted aralkyl group, a substituted or unsubstituted aryl group, or a substituted or unsubstituted heterocyclic group, and $R_4$ and $R_5$ may be the same or different from each other; $R_6$ and $R_7$ each represent a substituted or unsubstituted alkyl group, a substituted or unsubstituted aralkyl group, a substituted or unsubstituted aryl group, a substituted or unsubstituted heterocyclic group, a substituted amino group, a cyano group, or a halogen atom, $R_6$ and $R_7$ may be the same or different from each other, and $R_6$'s or $R_7$'s may be the same or different from each other; $Ar_3$ and $Ar_4$ each represent a substituted or unsubstituted aryl group, or a substituted or unsubstituted heterocyclic group, and $Ar_3$ and $Ar_4$ may be the same or different from each other; m represents an integer of 1 or more to 10 or less; and b and c each represent an integer of 0 or more to 3 or less.

The light-emitting layer preferably contains a first compound represented by the general formula [1] and a second compound represented by the following general formula [3]:

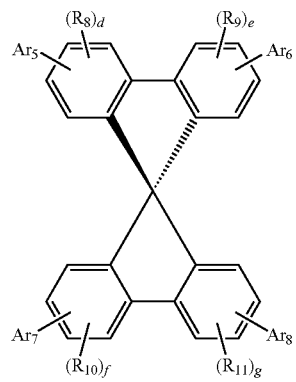

[3]

wherein $R_8$ to $R_{11}$ each represent a substituted or unsubstituted alkyl group, a substituted or unsubstituted aralkyl group, a substituted or unsubstituted aryl group, a substituted or unsubstituted heterocyclic group, a substituted amino group, a cyano group, or a halogen atom, $R_8$ to $R_{11}$ may be the same or different from one another, and $R_8$'s, $R_9$'s, $R_{10}$'s, or $R_{11}$'s may be the same or different from each other; $Ar_5$ to $Ar_8$ each represent a substituted or unsubstituted aryl group, or a substituted or unsubstituted heterocyclic group, and $Ar_5$ to $Ar_8$ may be the same or different from one another; and d, e, f, and g each represent an integer of 0 or more to 3 or less The light-emitting layer preferably contains a first compound represented by the general formula [1] and a second compound represented by the following general formula [4]:

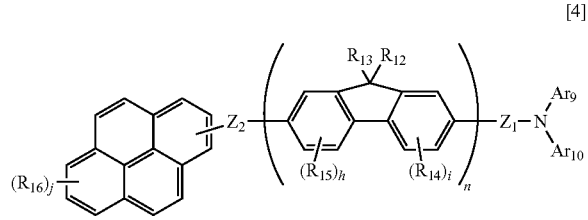

[4]

wherein $R_{12}$ and $R_{13}$ each represent a hydrogen atom, a substituted or unsubstituted alkyl group, a substituted or unsubstituted aralkyl group, a substituted or unsubstituted aryl group, or a substituted or unsubstituted heterocyclic group, and $R_{12}$ and $R_{13}$ may be the same or different from each other; $R_{14}$ and $R_{15}$ each represent a substituted or unsubstituted alkyl group, a substituted or unsubstituted aralkyl group, a substituted or unsubstituted aryl group, a substituted or unsubstituted heterocyclic group, a substituted amino group, a cyano group, or a halogen atom, $R_{14}$ and $R_{15}$ may be the same or different from each other, and $R_{14}$'s or $R_{15}$'s may be the same or different from each other; $R_{16}$ represents a substituted or unsubstituted alkyl group, a substituted or unsubstituted aralkyl group, a substituted or unsubstituted aryl group, or a substituted or unsubstituted heterocyclic group, and $R_{16}$'s may be the same or different from each other; $Z_1$ and $Z_2$ each represent a group selected from the group consisting of a direct single bond, a substituted or unsubstituted alkylene group, a substituted or unsubstituted alkenylene group, a substituted or unsubstituted alkynylene group, a substituted or unsubstituted aralkylene group, a substituted or unsubstituted arylene group, a substituted or unsubstituted divalent heterocyclic group, a substituted or unsubstituted silyl group, an ether group, a thioether group, and a carbonyl group, and each of $Z_1$ and $Z_2$ may further have a linking group; $Ar_9$ and $Ar_{10}$ each represent a substituted or unsubstituted aryl group, or a substituted or unsubstituted heterocyclic group, $Ar_9$ and $Ar_{10}$ may be the same or different from each other, and $Ar_9$ and $Ar_{10}$ may form a ring; n represents an integer of 1 or more to 10 or less; h and i each represent an integer of 0 or more to 3 or less; and j represents an integer of 0 or more to 9 or less.

The light-emitting layer preferably contains a first compound represented by the general formula [1] and a second compound represented by the following general formula [5]:

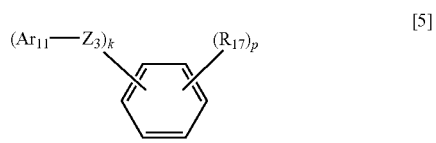

[5]

wherein $Ar_{11}$ represents a group selected from the group consisting of a substituted or unsubstituted aralkyl group, a substituted or unsubstituted aryl group, and a substituted or unsubstituted heterocyclic group, and, when k represents 2 or more, $Ar_{11}$'s may be the same or different from each other; $Z_3$ represents a group selected from the group consisting of a direct single bond, a substituted or unsubstituted alkylene group, a substituted or unsubstituted alkenylene group, a substituted or unsubstituted alkynylene group, a substituted or unsubstituted aralkylene group, a substituted or unsubstituted arylene group, a substituted or unsubstituted, divalent heterocyclic group, a substituted or unsubstituted silyl group, an ether group, a thioether group, and a carbonyl group, $Z_3$ may further have a linking group, and, when k represents 2 or more, $Z_3$'s may be the same or different from each other; $R_{17}$ represents a group selected from the group consisting of a halogen atom, a substituted or unsubstituted alkyl group, a substituted or unsubstituted alkoxy group, a substituted or unsubstituted sulfide group, a substituted or unsubstituted amino group, and a substituted or unsubstituted silyl group, and, when p represents 2 or more, $R_{17}$'s may be the same or different from each other; and k represents an integer of 1 or more to 6 or less, and p represents an integer of 0 or more to 5 or less, provided that a relationship of $k+p \leq 6$ is satisfied.

By containing a silyl compound in which a silyl group is directly bonded to an anthracene ring particularly in the light-emitting layer of the organic light-emitting device of the present invention, light can be obtained therefrom with high efficiency. The organic light-emitting device of the present invention emits light with high efficiency at a low applied voltage, and is excellent in durability.

Further features of the present invention will become apparent from the following description of exemplary embodiments with reference to the attached drawings.

DESCRIPTION OF THE EMBODIMENTS

Figure 1:
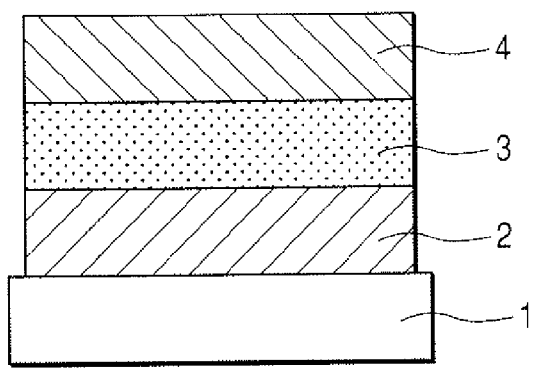
FIG. 1 is a sectional view showing an example of an organic light-emitting device according to the present invention.

Hereinafter, the present invention will be described in detail.

The organic light-emitting device of the present invention is an organic light-emitting device including: a pair of electrodes composed of an anode and a cathode; and an organic compound layer interposed between the pair of electrodes, wherein the organic compound layer contains a compound represented by the following general formula [1].

Specifically, the organic light-emitting device of the present invention is an organic light-emitting device including: a pair of electrodes composed of an anode and a cathode at least one of which is transparent or semi-transparent; and one or more layers each containing an organic compound, the one or more layers being interposed between the pair of electrodes, wherein at least one layer of the one or more layers each containing an organic compound contains a compound represented by the following general formula [1] (referred to as "silyl compound").

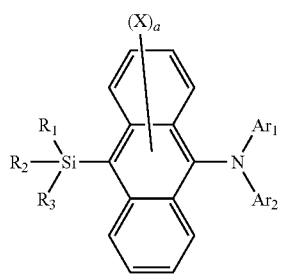

[1]

where $Ar_1$ and $Ar_2$ each represent a group selected from the group consisting of a substituted or unsubstituted alkyl group, a substituted or unsubstituted aralkyl group, a substituted or unsubstituted aryl group, and a substituted or unsubstituted heterocyclic group, $Ar_1$ and $Ar_2$ may be the same or different from each other, and $Ar_1$ and $Ar_2$ may be bonded to each other to form a ring; $R_1$, $R_2$, and $R_3$ each represent a group selected from the group consisting of a hydrogen atom, a halogen atom, a substituted or unsubstituted alkyl group, a substituted or unsubstituted aralkyl group, a substituted or unsubstituted aryl group, and a substituted or unsubstituted heterocyclic group, and $R_1$, $R_2$, and $R_3$ may be the same or different from one another; X represents a group selected from the group consisting of a halogen atom, a substituted or unsubstituted alkyl group, a substituted or unsubstituted aralkyl group, a substituted or unsubstituted alkenyl group, a substituted or unsubstituted alkynyl group, a substituted or unsubstituted alkoxy group, a substituted or unsubstituted sulfide group, a substituted or unsubstituted silyl group, a substituted or unsubstituted amino group, a substituted or unsubstituted aryl group, and a substituted or unsubstituted heterocyclic group, and X's may be the same or different from each other; and a represents an integer of 0 or more to 8 or less.

First, description will be given of the silyl compound having a structure that a silyl group and an amino group are directly bonded to an anthracene ring, the silyl compound being used in the one or more layers each containing an organic compound in the organic light-emitting device of the present invention, the one or more layers being interposed between the pair of electrodes composed of the anode and the cathode.

The silyl compound to be used in the present invention can be used as a material for an organic light-emitting device. When the compound is used for a light-emitting layer in the device, the silyl compound can be used alone in the light-emitting layer, and can be used to serve as a dopant (guest) material or a host material, whereby a light-emitting device having a high color purity, high emission efficiency, and a long lifetime can be obtained.

The compound to be used in the present invention has a structure that a silyl group is directly bonded onto an anthracene ring of an aminoanthracene compound that mainly emits green light, which realizes an improvement in fluorescent quantum efficiency, that is, highly efficient light emission in an organic light-emitting. An effect of the introduction of a silyl group into anthracene on an improvement in fluorescent quantum efficiency is described in a document (Organometallics, 1996, 15, p. 1067 to 1070). In the present invention, a device design has been performed in such a manner that an organic compound obtained by directly introducing a silyl group into an anthracene ring of an aminoanthracene light-emitting unit is used as a material for an organic light-emitting device which is composed of one or more layers each containing an organic compound, wherein the one or more layers are interposed between a pair of electrodes composed of an anode and a cathode, and the obtained organic compound is used mainly in a light-emitting layer. As a result, an organic light-emitting device having high efficiency and a long lifetime has been obtained.

The silyl compound represented by the general formula [1] to be used in the present invention can be used as a material for one or more layers each containing an organic compound in an organic light-emitting device. The silyl compound may be used alone, or may be used in combination with a compound represented by any one of the general formulae [2] to [5]. When the silyl compound is in combination with the compound represented by any one of the general formulae [2] to [5] before use, the content of the silyl compound is desirably in a range of 0.01 wt % or more to 80 wt % or less, or preferably 1 wt % or more to 40 wt % or less with respect to the total of the silyl compound and the compound represented by any one of the general formulae [2] to [5].

For example, when an anthracene compound is used as a dopant material in the organic light-emitting device of the present invention, a dopant concentration with respect to a host material is 0.01 wt % or more and 80 wt % or less, or preferably 1 wt % or more and 40 wt % or less. The dopant material may be uniformly incorporated into the entirety of a layer composed of the host material, or may be incorporated into the entirety of the layer so that the dopant material has a concentration gradient. Alternatively, the dopant material may be partially incorporated into a region of the host material layer so that the host material layer has a region free of the dopant material.

In each of the general formulae [1] to [5], a hydrogen atom that constitutes any one of a hydrogen atom group and the following substituents may be substituted by a deuterium atom.

Examples of a substituted or unsubstituted alkyl group in the general formulae (1) to (5) include, but are not limited to, a methyl group; a methyl-d1 group; a methyl-d3 group; an ethyl group; an ethyl-d5 group; an n-propyl group; an n-butyl group; an n-pentyl group; an n-hexyl group; an n-heptyl group; an n-octyl group; an n-decyl group; an iso-propyl group; an iso-propyl-d7 group; an iso-butyl group; a sec-butyl group; a tert-butyl group; a tert-butyl-d9 group; an iso-pentyl group; a neopentyl group; a tert-octyl group; a fluoromethyl group; a difluoromethyl group; a trifluoromethyl group; a 2-fluoroethyl group; a 2,2,2-trifluoroethyl group; a perfluoroethyl group; a 3-fluoropropyl group; a perfluoropropyl group; a 4-fluorobutyl group; a perfluorobutyl group; a 5-fluoropentyl group; a 6-fluorohexyl group; a chloromethyl group; a trichloromethyl group; 2-chloroethyl group; a 2,2,2- trichloroethyl group; a 4-chlorobutyl group; a 5-chloropentyl group; a 6-chlorohexyl group; a bromomethyl group; a 2-bromoethyl group; an iodomethyl group; a 2-iodoethyl group; a hydroxymethyl group; a hydroxyethyl group; a cyclopropyl group; a cyclobutyl group; a cyclopentyl group; a cyclohexyl group; a cyclopentylmethyl group; a cyclohexylmethyl group; a cyclohexylethyl group; a 4-fluorocyclohexyl group; a norbornyl group; and an adamantyl group. Here, d1 of the methyl-d1 group indicates that one of the hydrogen atoms of the methyl group is substituted by one deuterium atom.

Examples of a substituted or unsubstituted aralkyl group include, but are not limited to, a benzyl group; a 2-phenylethyl group; a 2-phenylisopropyl group; a 1-naphthylmethyl group; a 2-naphthylmethyl group; a 2-(1-napthyl)ethyl group; a 2-(2-napthyl)ethyl group; a 9-anthrylmethyl group; a 2-(9-anthryl)ethyl group; a 2-fluorobenzyl group; a 3-fluorobenzyl group; a 4-fluorobenzyl group; a 2-chlorobenzyl group; a 3-chlorobenzyl group; a 4-chlorobenzyl group; a 2-bromobenzyl group; a 3-bromobenzyl group; and a 4-bromobenzyl group.

Examples of a substituted or unsubstituted alkenyl group include, but are not limited to, a vinyl group; an allyl group (2-propenyl group); a 1-propenyl group; an iso-propenyl group; a 1-butenyl group; a 2-butenyl group; a 3-butenyl group; and a styryl group.

Examples of a substituted or unsubstituted alkynyl group include, but are not limited to, an acetylenyl group; a phenylacetylenyl group; and a 1-propynyl group.

Examples of a substituted or unsubstituted aryl group include, but are not limited to, a phenyl group; a phenyl-d5 group; a 4-methylphenyl group; a 4-methoxyphenyl group; a 4-ethylphenyl group; a 4-fluorophenyl group; a 4-trifluorophenyl group; a 3,5-dimethylphenyl group; a 2,6-diethylphenyl group; a mesityl group; a 4-tert-butylphenyl group; a ditolylaminophenyl group; a biphenyl group; a terphenyl group; a naphthyl group; a naphthyl-d7 group; an acenaphthylenyl group; an anthryl group; an anthryl-d9 group; a phenanthryl group; a phenanthryl-d9 group; a pyrenyl group; a pyrenyl-d9 group; an acephenanthrylenyl group; an aceanthrylenyl group; a chrysenyl group; a dibenzo chrysenyl group; a benzoanthryl group; a benzoanthryl-d11 group; a dibenzoanthryl group; a naphthacenyl group; a picenyl group; a pentacenyl group; a fluorenyl group; a triphenylenyl group; a perylenyl group; and a perylenyl-d11 group.

Examples of a substituted or unsubstituted heterocyclic group include, but are not limited to, a pyrrolyl group; a pyridyl group; a pyridyl-d5 group; a bipyridyl group; a methylpyridyl group; a pyrimidinyl group; a pyrazinyl group; a pyridazinyl group; a terpyrrolyl group; a thienyl group; a thienyl-d4 group; a terthienyl group; a propylthienyl group; a benzothienyl group; a dibenzothienyl group; a dibenzothienyl-d7 group; a furyl group; a furyl-d4 group; a benzofuryl group; an isobenzofuryl group; dibenzofuryl group; a dibenzofuryl-d7 group; a quinolyl group; a quinolyl-d6 group; an isoquinolyl group; a quinoxalinyl group; a naphthylidinyl group; a quinazolinyl group; a phenanthridinyl group; an indolizinyl group; a phenazinyl group; a carbazolyl group; an oxazolyl group; an oxadiazolyl group; a thiazolyl group; a thiadiazolyl group; an acridinyl group; and a phenazinyl group.

In a substituted or unsubstituted amino (—NR'R'') group, examples of R' and R'' include, but are not limited to, a hydrogen atom; a deuterium atom; the above-mentioned substituted or unsubstituted alkyl group, aralkyl group, aryl group, or heterocyclic group; an alkyl group, alkenyl group, alkynyl group, aralkyl group, or amino group bonded through a substituted or unsubstituted arylene group or divalent heterocyclic group; a silyl group; an ether group; a thioether group; and a carbonyl group. Examples of the substituted or unsubstituted amino group include, but are not limited to, an amino group; an N-methylamino group; an N-ethylamino group; an N,N-dimethylamino group; an N,N-diethylamino group; an N-methyl-N-ethylamino group; an N-benzylamino group; an N-methyl-N-benzylamino group; an N,N-dibenzylamino group; an anilino group; an N,N-diphenylamino group; an N-phenyl-N-tolylamino group; an N,N-ditolylamino group; an N-methyl-N-phenylamino group; an N,N-dianisolylamino group; an N-mesityl-N-phenylamino group; an N,N-dimesitylamino group; an N-phenyl-N-(4-tert-butylphenyl)amino group; and an N-phenyl-N-(4-trifluoromethylphenyl)amino group.

Examples of a substituted or unsubstituted alkoxy group include an alkyloxy group or aralkyloxy group having the above-mentioned substituted or unsubstituted alkyl group or aralkyl group; and an aryloxy group having the above-mentioned substituted or unsubstituted aryl group or heterocyclic group. Specific examples thereof include, but are not limited to, a methoxy group; an ethoxy group; a propoxy group; a 2-ethyl-octyloxy group; a phenoxy group; a 4-tert-butylphenoxy group; a benzyloxy group; and a thienyloxy group.

Examples of a substituted or unsubstituted sulfide group include an alkylsulfide group or aralkylsulfide group having the above-mentioned substituted or unsubstituted alkyl group or aralkyl group; and an arylsulfide group having the above-mentioned substituted or unsubstituted aryl group or heterocyclic group. Specific examples thereof include, but are not limited to, a methylsulfide group; an ethylsulfide group; a phenylsulfide group; and a 4-methylphenyl sulfide group.

Examples of the substituted or unsubstituted silyl group include, but are not limited to, a trimethylsilyl group, a triethylsilyl group, a tert-butyldimethylsilyl group, an iso-propyldimethylsilyl group, a triphenylsilyl group, a phenyldimethylsilyl group, a mesityldimethylsilyl group, and a dimesitylmethylsilyl group.

Examples of the substituted or unsubstituted alkylene group include, but are not limited to, a methylene group, an ethylene group, a propylene group, a 2-methylpropylene group, a fluoromethylene group, a difluoromethylene group, a bromomethylene group, and a bromoethylene group.

Examples of a substituted or unsubstituted aralkylene group include, but are not limited to, a benzylene group; a 2-phenylethylene group; a 2-phenylisopropylene group; a 1-naphthylmethylene group; a 2-naphthylmethylene group; a 9-anthrylmethylene group; a 2-fluorobenzylene group; a 3-fluorobenzylene group; a 4-fluorobenzylene group; a 4-chlorobenzylene group; and a 4-bromobenzylene group.

Examples of a substituted or unsubstituted alkenylene group include, but are not limited to, a vinylene group; an iso-propenylene group; a styrylene group; and a 1,2-diphenylvinylene group.

Examples of a substituted or unsubstituted alkynylene group include, but are not limited to, an acetylenylene group and a phenyl acetylenylene group.

Examples of a substituted or unsubstituted arylene group include, but are not limited to, a phenylene group; a biphenylene group; a tetrafluorophenylene group; a dimethylphenylene group; a naphthylene group; a phenanthrylene group; a pyrenylene group; a tetracenylene group; a pentacenylene group; and a perylenylene group.

Examples of a substituted or unsubstituted divalent heterocyclic group include, but are not limited to, a furylene group; a pyrrolylene group; a pyridylene group; a terpyridylene group; a thienylene group; a terthienylene group; an oxazolylene group; a thiazolylene group; and a carbazolylene group.

Examples of the linking group include, but are not limited to, the substituted or unsubstituted alkylene group, the substituted or unsubstituted alkenylene group, the substituted or unsubstituted alkynylene group, the substituted or unsubstituted aralkylene group, the substituted or unsubstituted arylene group, and the substituted or unsubstituted divalent heterocyclic group, as described above.

Examples of a substituent which the above-mentioned substituents may further have include, but are not limited to, a deuterium atom; an alkyl group or aralkyl group such as a methyl group, an ethyl group, an n-propyl group, an n-butyl group, an n-pentyl group, an n-hexyl group, an n-heptyl group, an n-octyl group, an n-decyl group, an iso-propyl group, an iso-butyl group, a sec-butyl group, a tert-butyl group, an iso-pentyl group, a neopentyl group, a tert-octyl group, a benzyl group, or a 2-phenylethyl group; an alkoxy group such as a methoxy group, an ethoxy group, a propoxy group, a 2-ethyl-octyloxy group, a phenoxy group, a 4-tert-butylphenoxy group, or a benzyloxy group; an aryl group such as a phenyl group, a 4-methylphenyl group, a 4-ethylphenyl group, a 3-chlorophenyl group, a 3,5-dimethylphenyl group, a triphenylamino group, a biphenyl group, a terphenyl group, a naphthyl group, an anthryl group, a phenanthryl group, or a pyrenyl group; a heterocyclic group such as a pyridyl group, a bipyridyl group, a methylpyridyl group, a thienyl group, a terthienyl group, a propylthienyl group, a furyl group, a quinolyl group, a carbazolyl group, or an N-ethylcarbazolyl group; a halogen group; a hydroxyl group; a cyano group; and a nitro group.

Compounds to be used in the present invention are shown below. However, the present invention is not limited to those compounds.

Here, Me represents a methyl group, tBu represents a tert-butyl group, D represents a deuterium group, Ph represents a phenyl group, and Et represents an ethyl group.

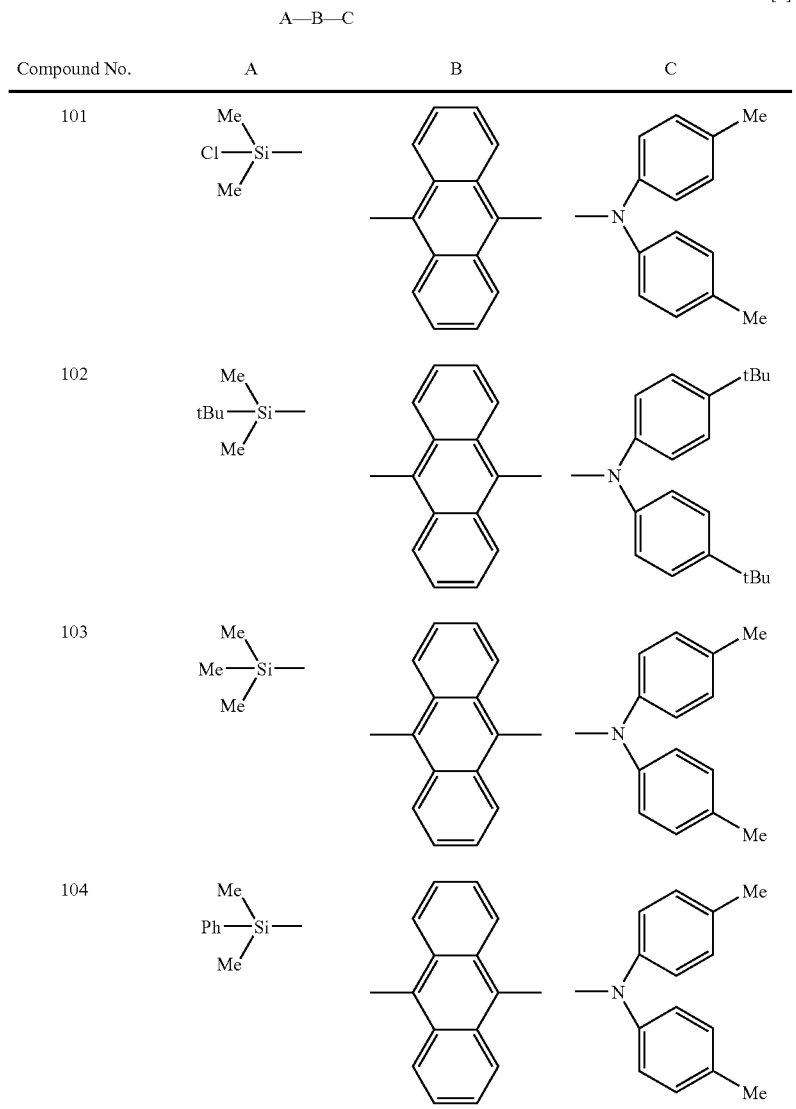

-continued

General formula [1]

A—B—C

| Compound No. | A | B | C |
|---|---|---|---|
| 105 | (mesityl)Si(Me)₂— | 9,10-anthracenediyl | N(3-MeC₆H₄)₂ |
| 106 | tBu(Me)₂Si— | 9,10-anthracenediyl | N(4-MeC₆H₄)₂ |
| 107 | tBu(Me)₂Si— | 9,10-anthracenediyl | NPh₂ |
| 108 | Me₃Si— | 9,10-anthracenediyl | N(4-tBuC₆H₄)₂ |
| 109 | (tBu)₂(Me)Si— | 9,10-anthracenediyl | N(4-tBuC₆H₄)₂ |

-continued
A—B—C  General formula [1]
| Compound No. | A | B | C |
|---|---|---|---|
| 110 | 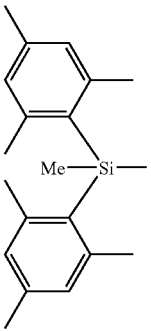 | 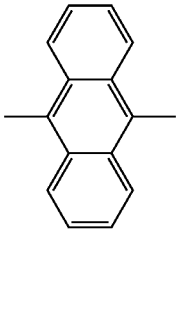 | 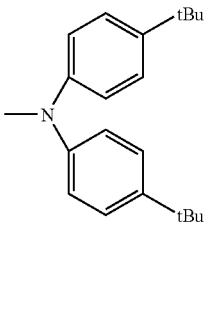 |
| 111 | 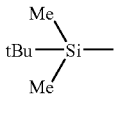 | 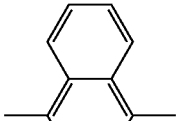 | 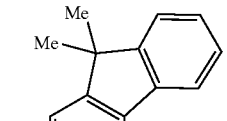 |
| 112 | 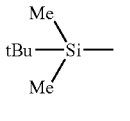 | 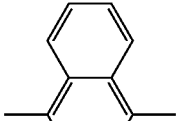 | 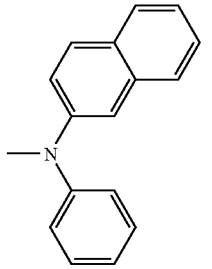 |
| 113 | 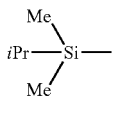 | 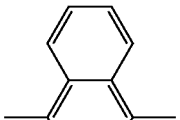 | 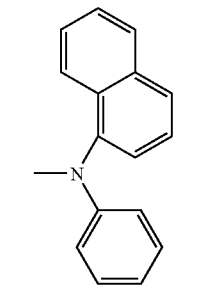 |
| 114 | 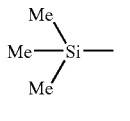 | 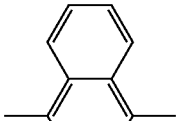 | 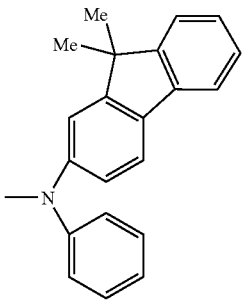 |

-continued
General formula [1]
A—B—C
| Compound No. | A | B | C |
|---|---|---|---|
| 115 | 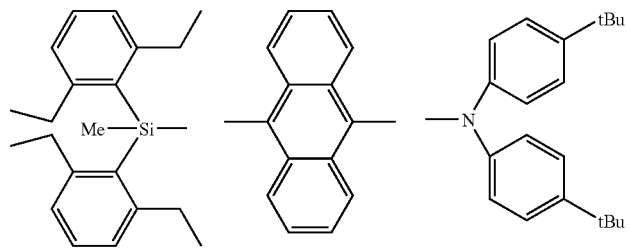 | | |
| 116 | 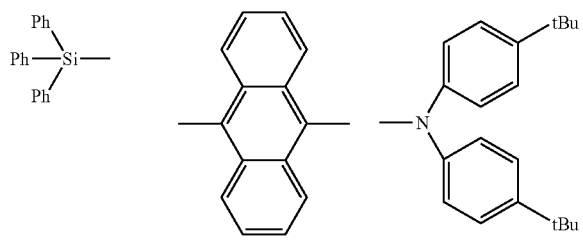 | | |
| 117 | 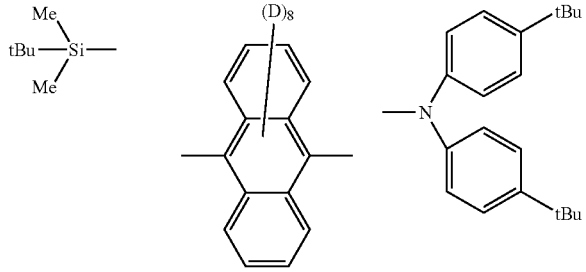 | | |
| 118 | 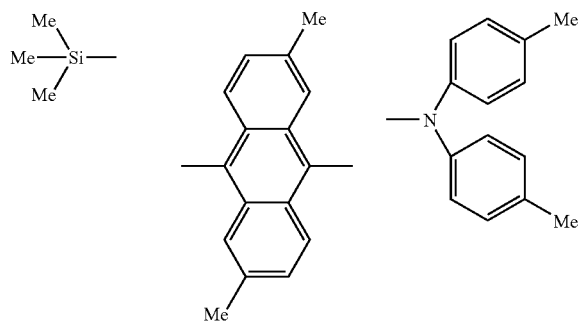 | | |
| 119 | 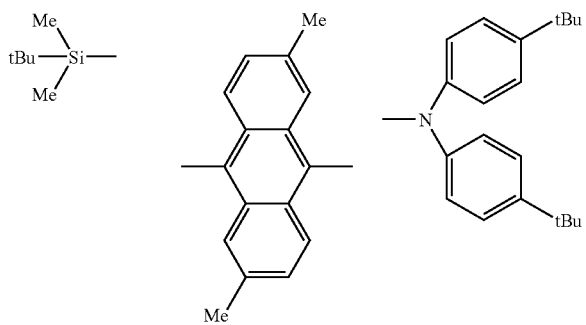 | | |

-continued
General formula [1]
A—B—C
| Compound No. | A | B | C |
|---|---|---|---|
| 120 | 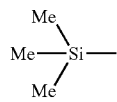 | 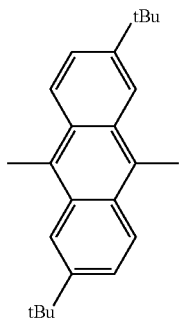 | 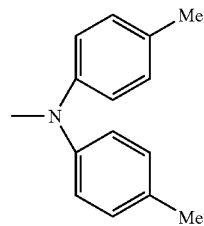 |
| 121 | 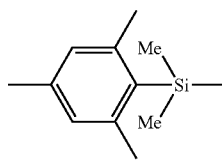 | 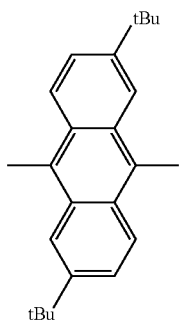 | 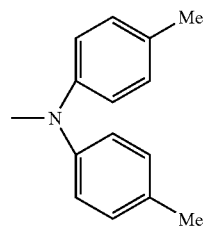 |
| 122 | 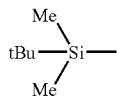 | 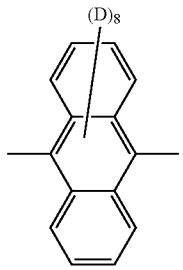 | 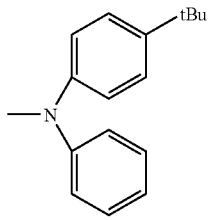 |
| 123 | 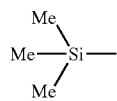 | 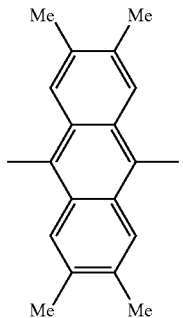 | 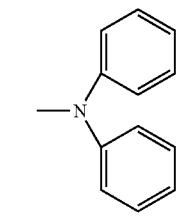 |

-continued
General formula [1]
A—B—C
| Compound No. | A | B | C |
| --- | --- | --- | --- |
| 124 | | | 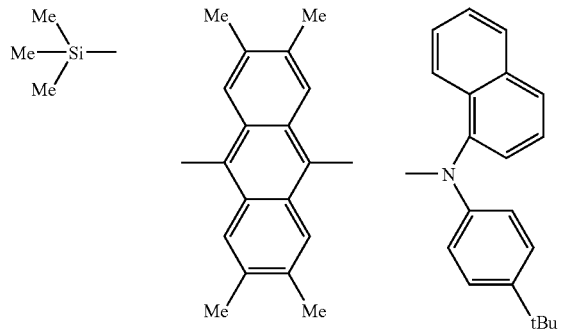 |
| 125 | | | 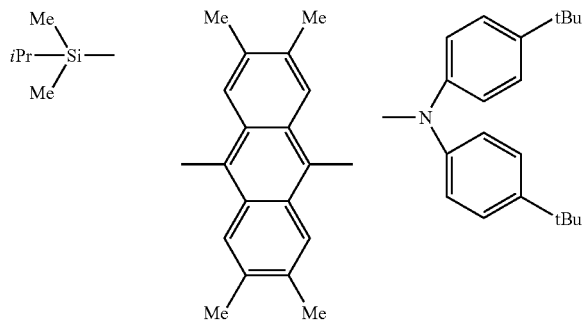 |
| 126 | | | 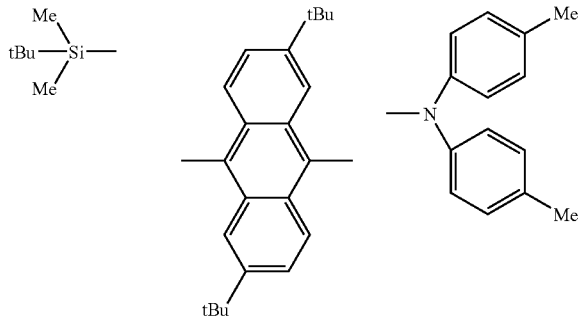 |
| 128 | | | 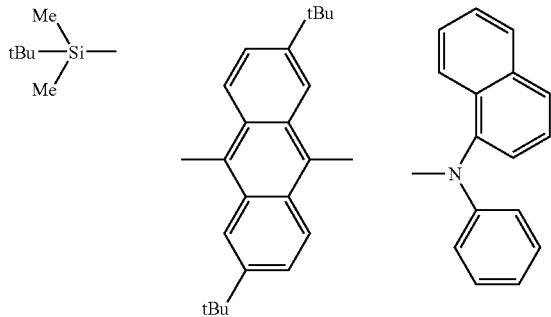 |

-continued

General formula [1]

A—B—C

| Compound No. | A | B | C |
| --- | --- | --- | --- |
| 129 | | | |
| 130 | | | |
| 131 | | | |
| 132 | | | |

-continued
General formula [1]
A—B—C
| Compound No. | A | B | C |
|---|---|---|---|
| 133 | 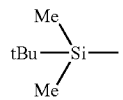 | 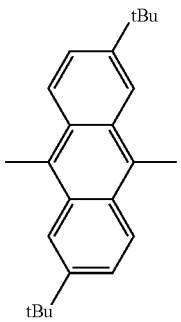 | 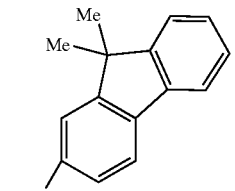 |
| 134 | 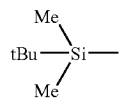 | 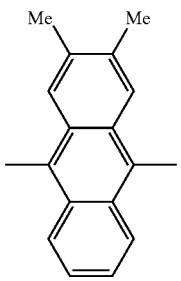 | 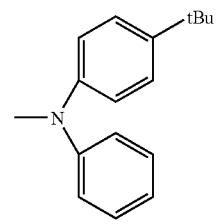 |
| 135 | 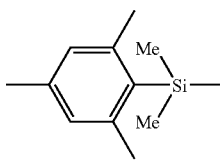 | 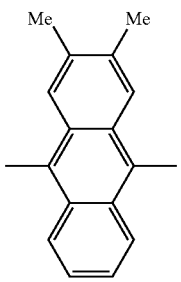 | 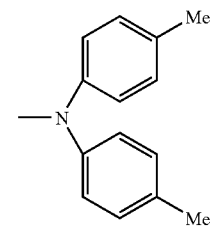 |
| 136 | 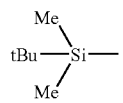 | 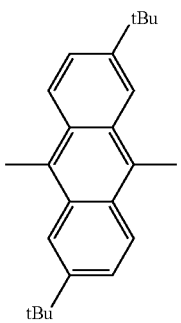 | 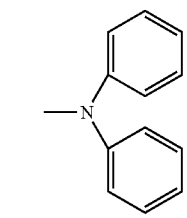 |

General formula [2]
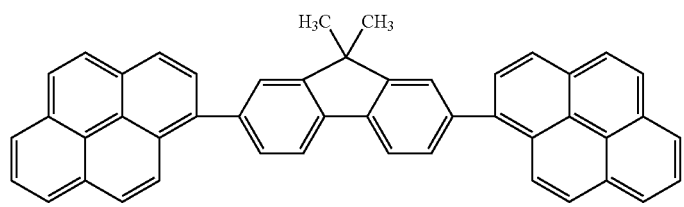
201
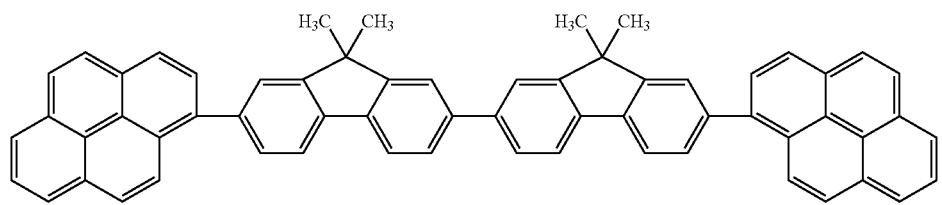
202
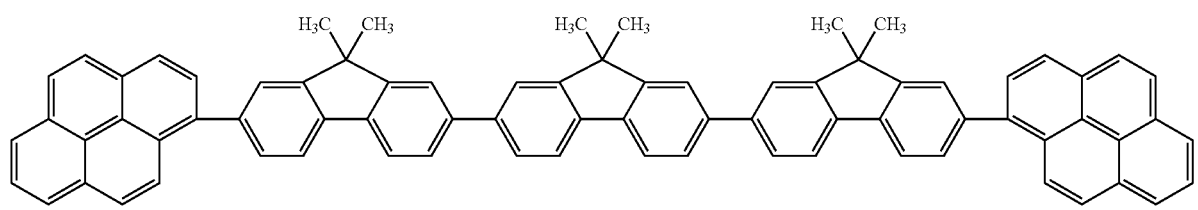
203
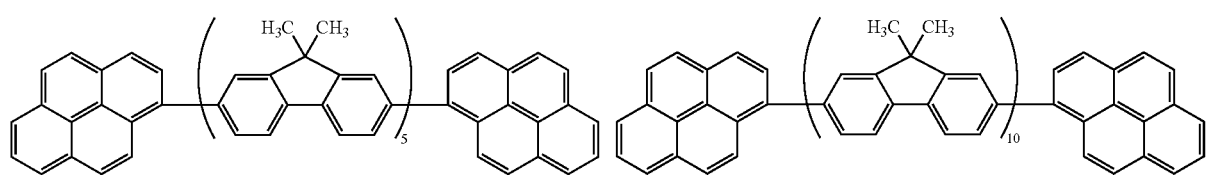
204
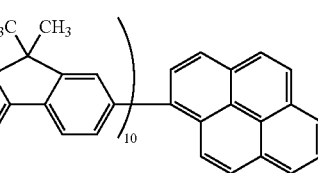
205
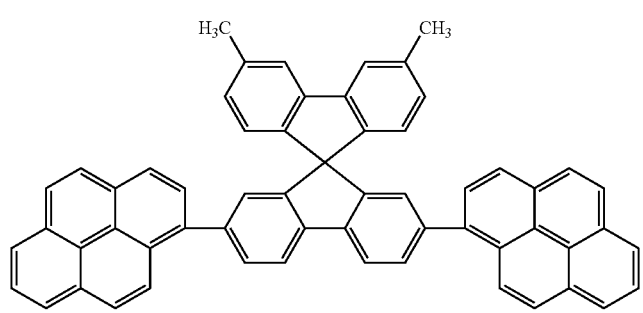
206
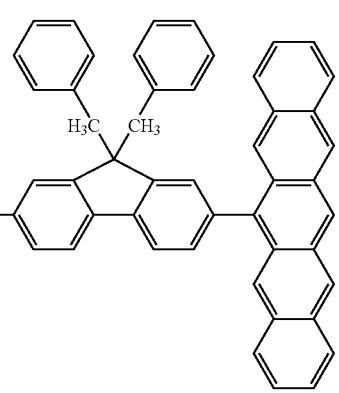
207
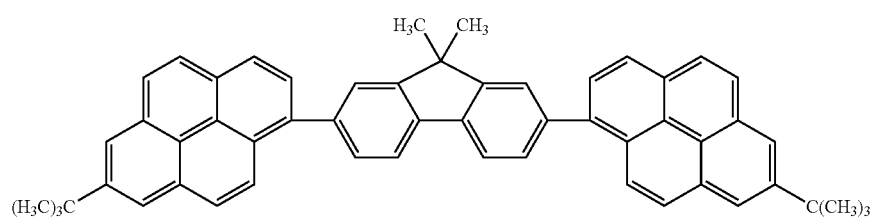
208

-continued
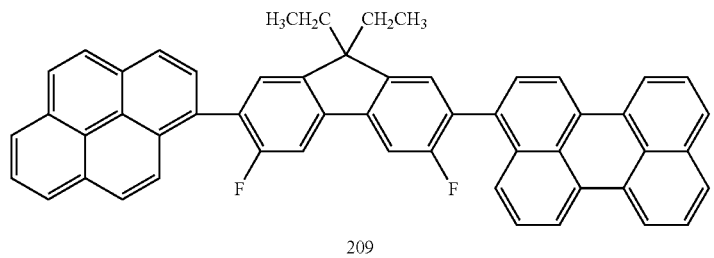
209
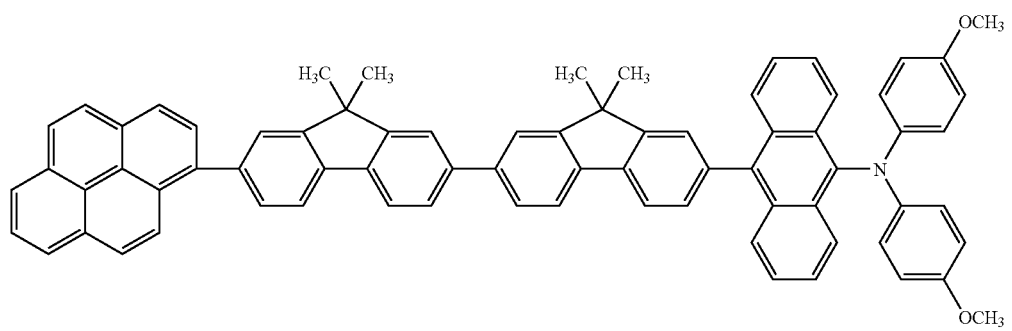
210
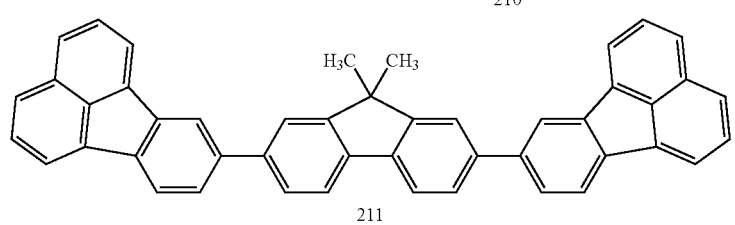
211
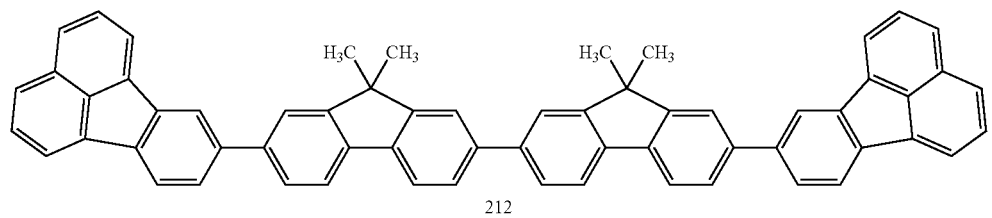
212
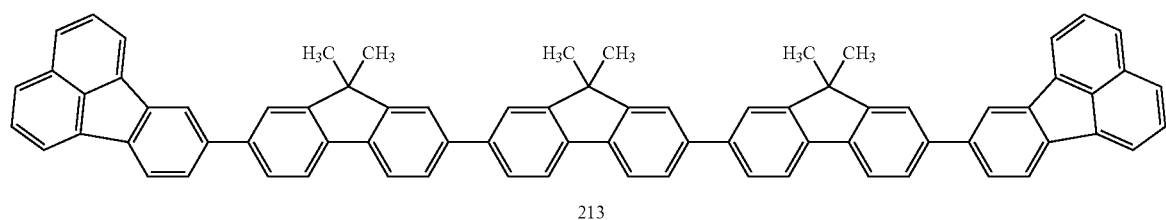
213
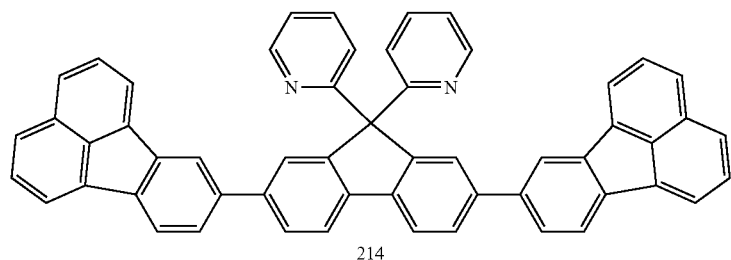
214

-continued
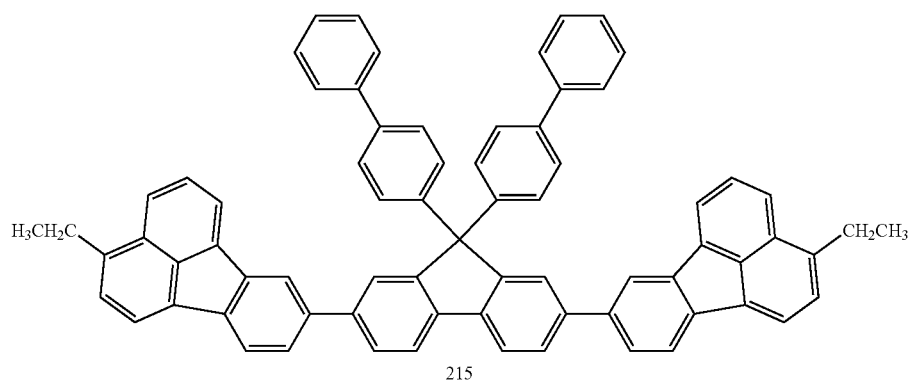
215
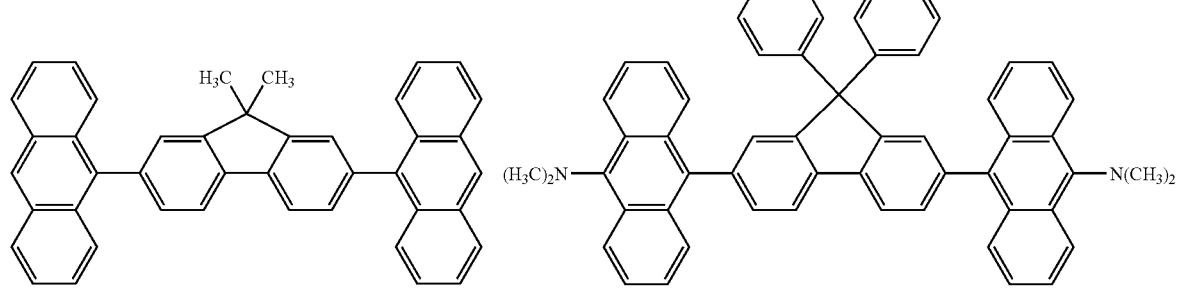
216
217
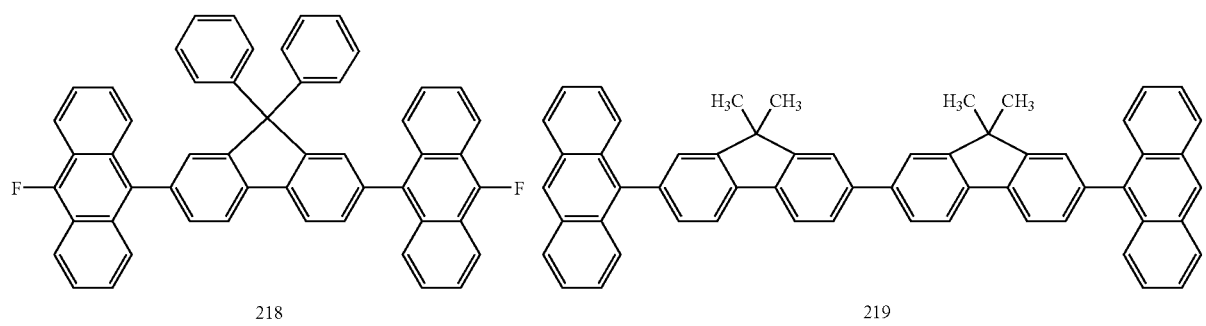
218
219
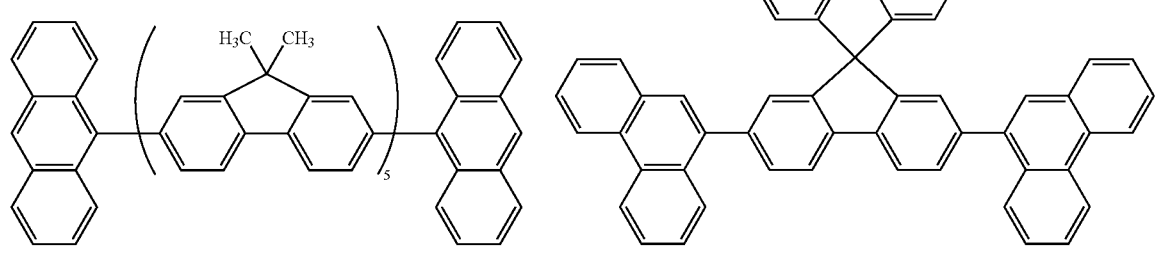
220
221
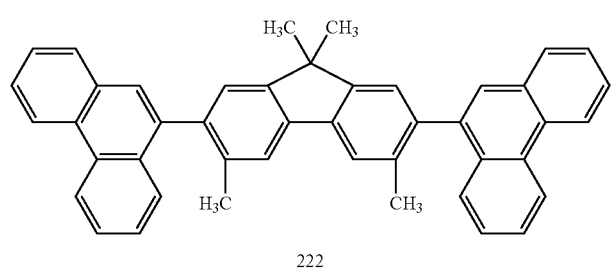
222

-continued
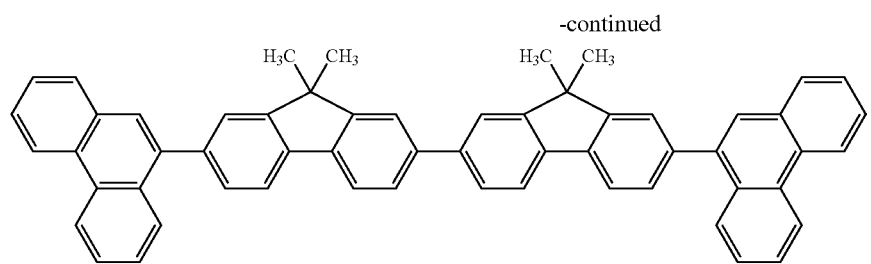
223
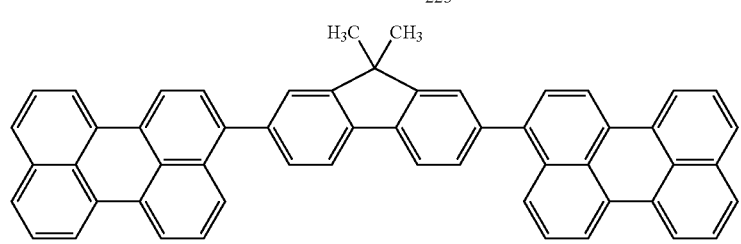
224
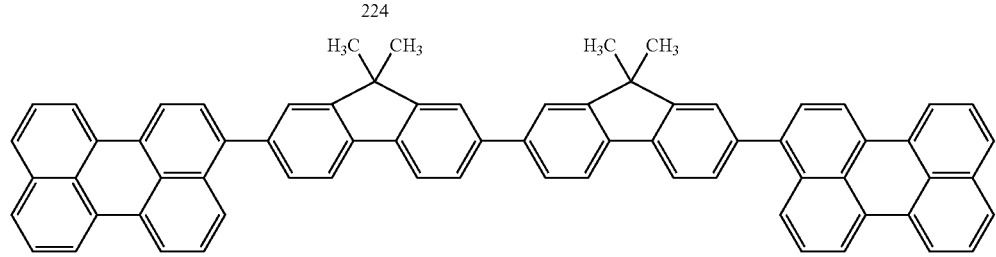
225
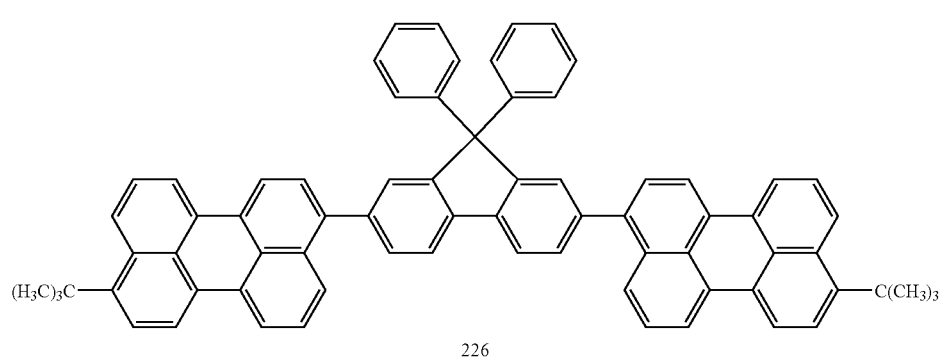
226
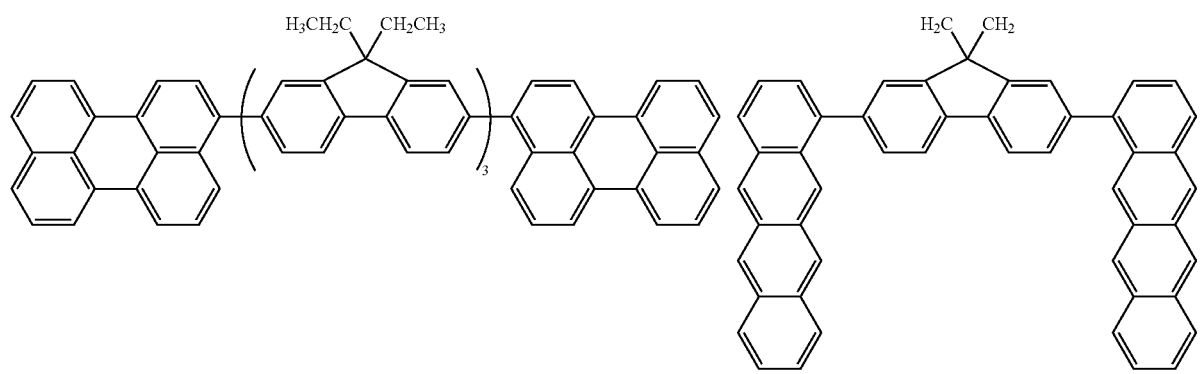
227
228

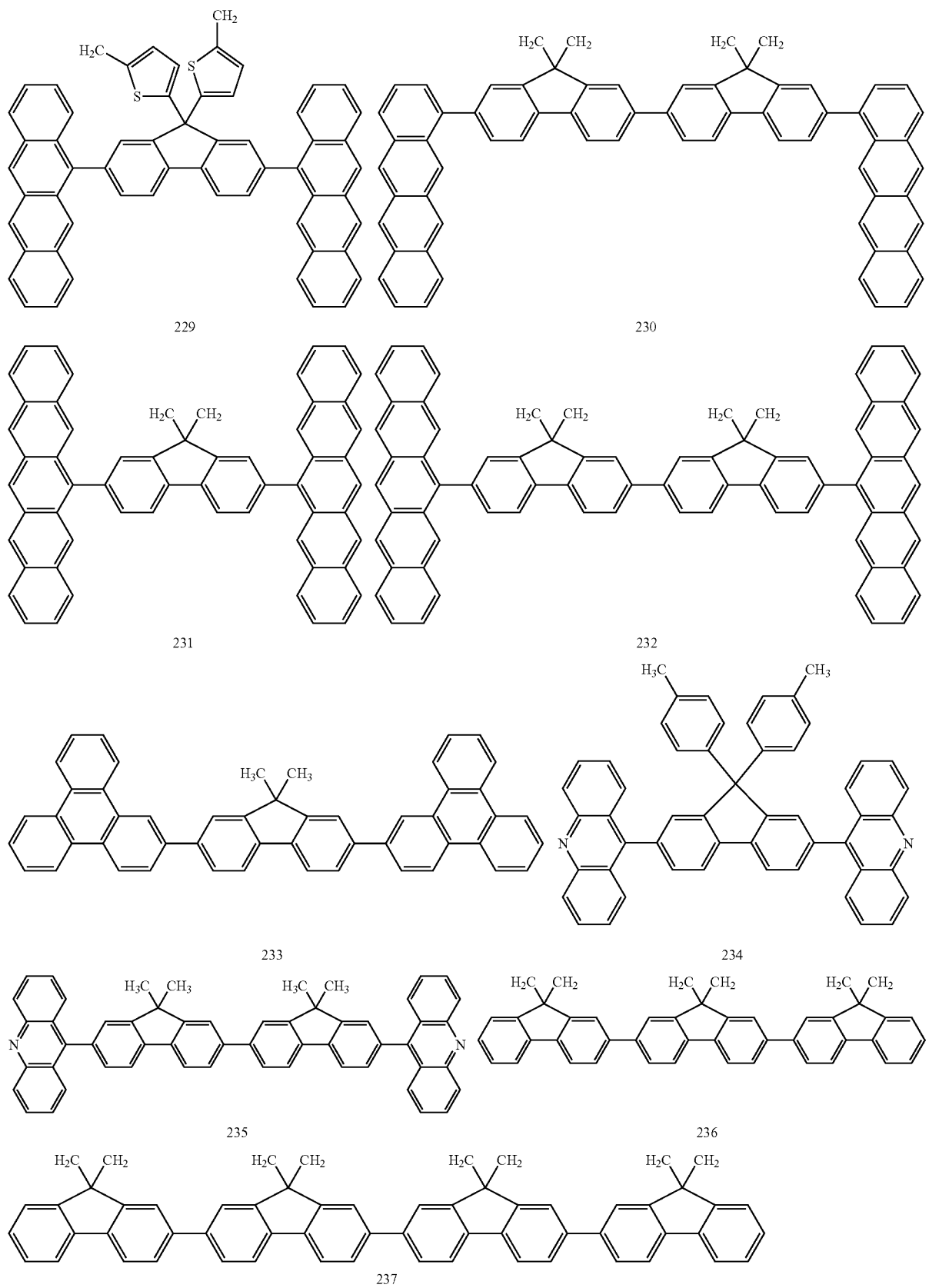

General formula [3]
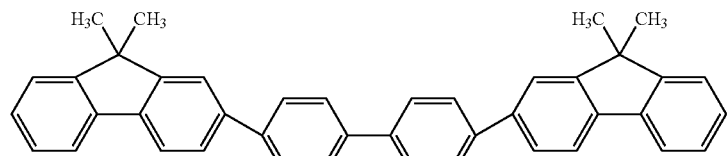
301
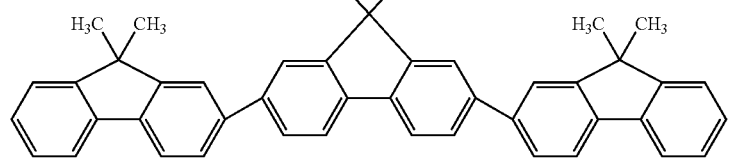
302
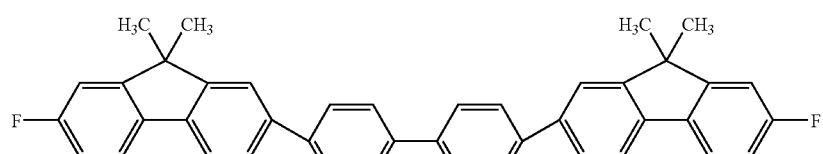
303
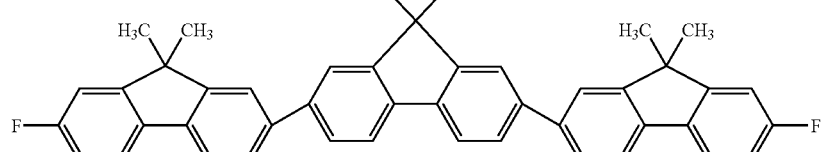
304
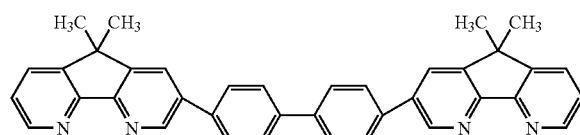
305
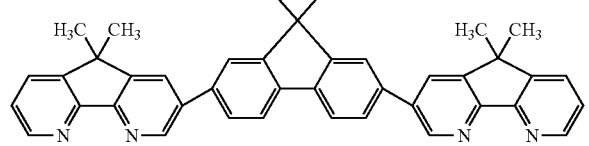
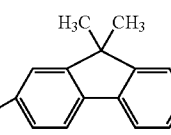
306
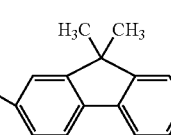

-continued
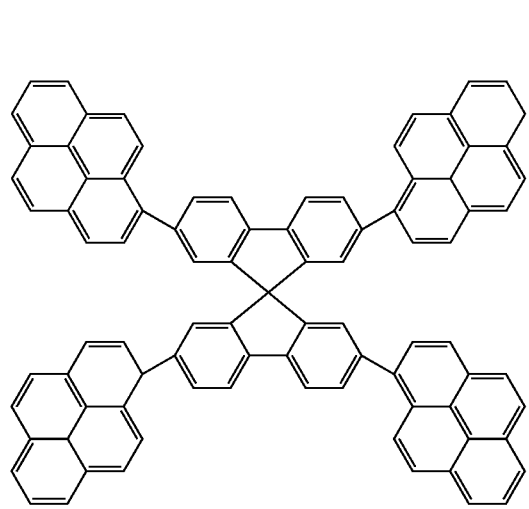
307
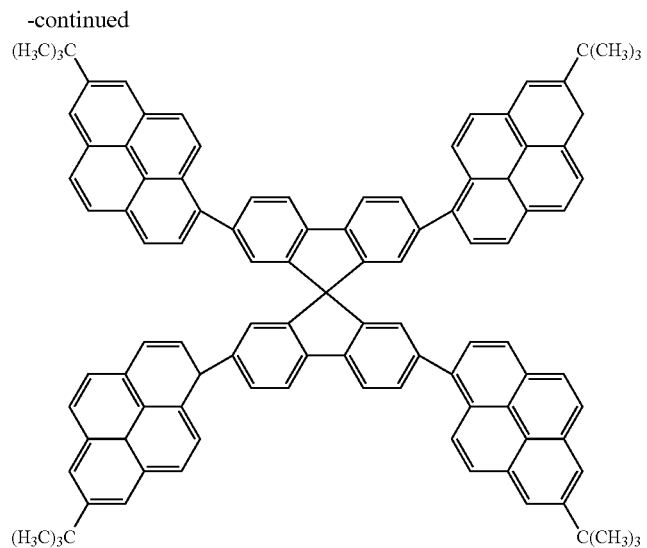
308
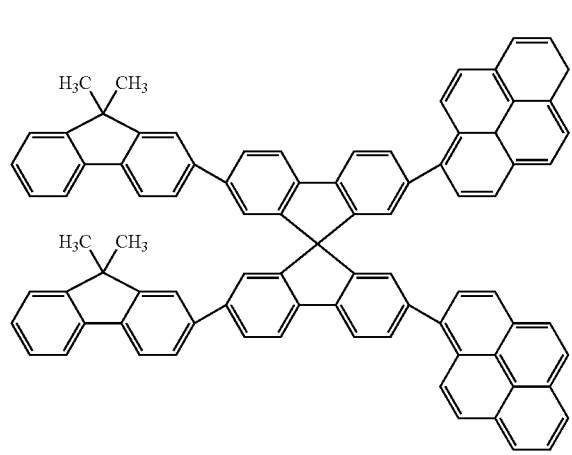
309
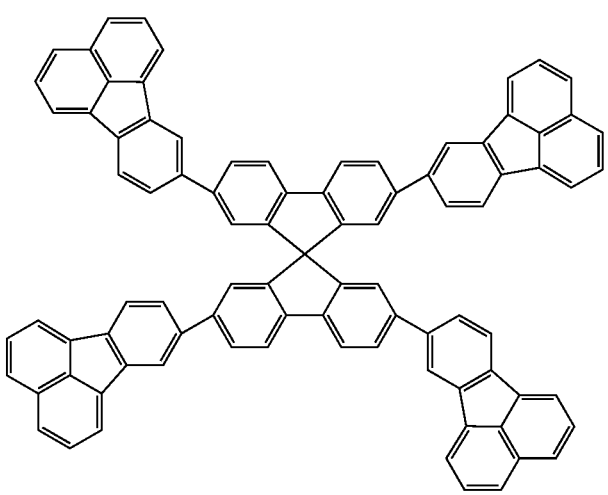
310
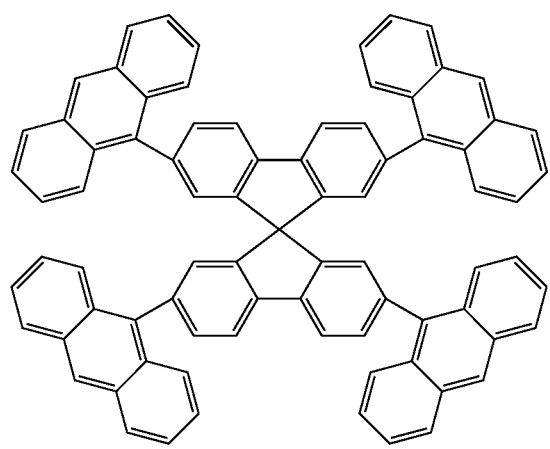
311
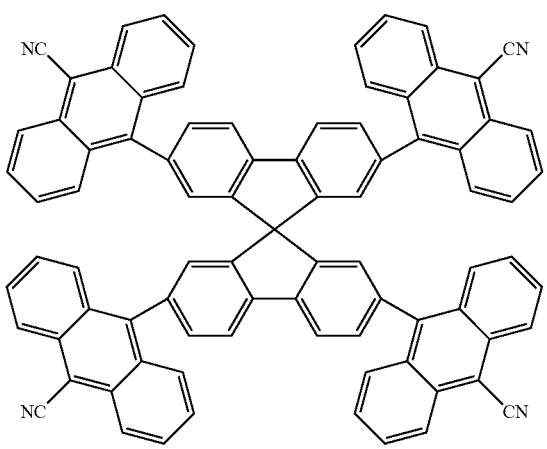
312

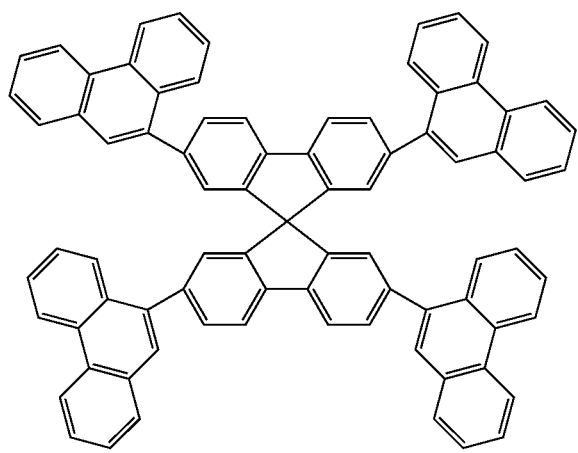
313
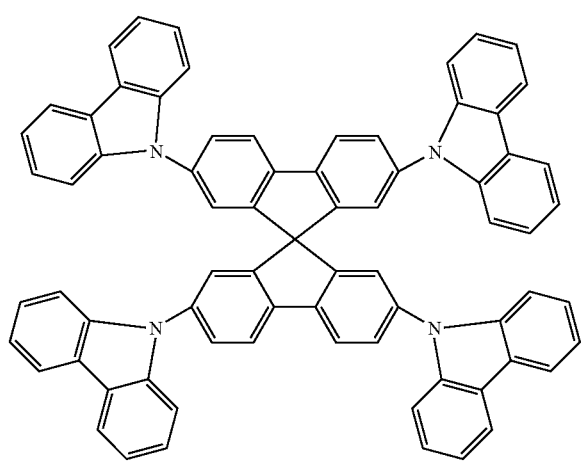
314
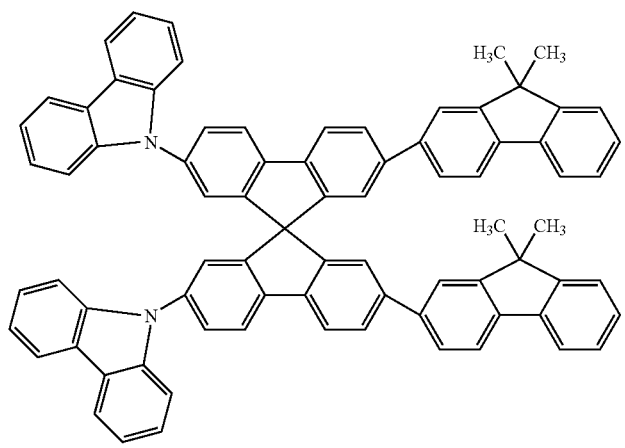
315
316
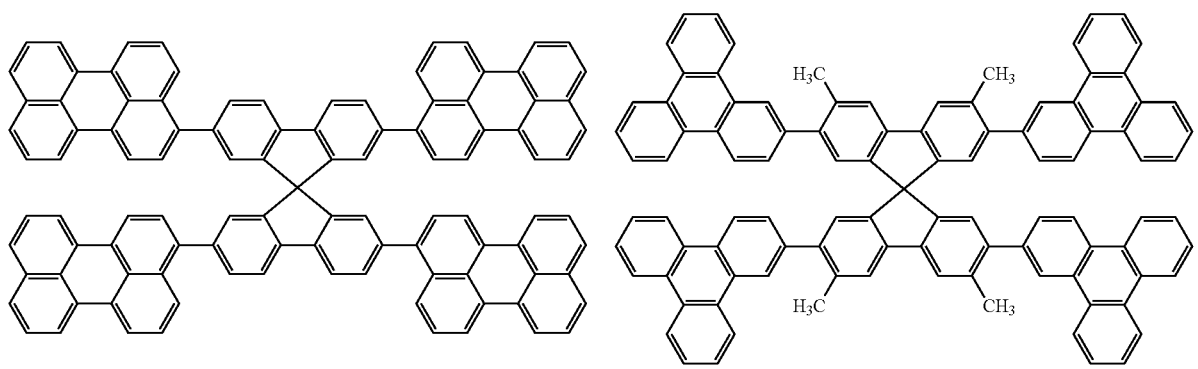
317
318

-continued
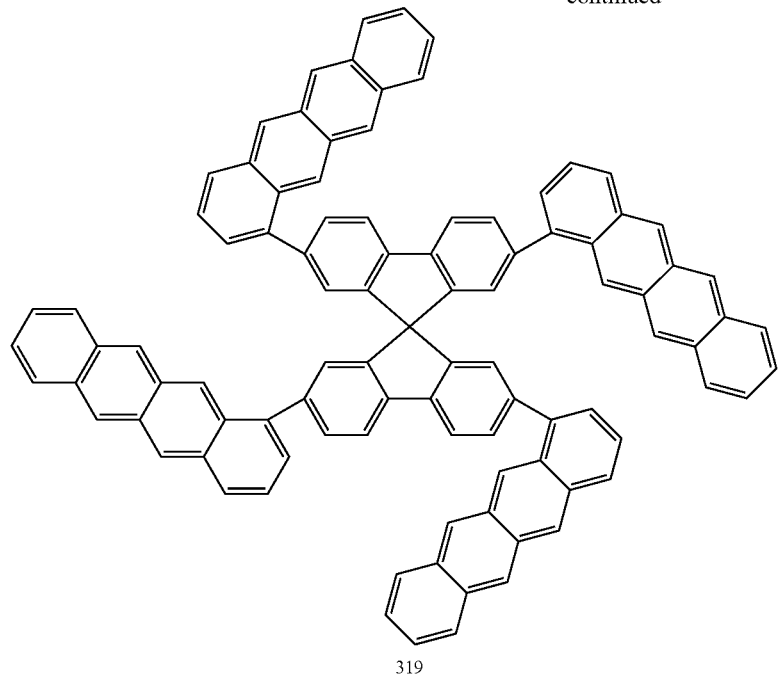
319

General formula [4]

| Compound No. | (R₁₀)j [pyrene] | Z2 | R₁₃ R₁₂ (R₁₄)i / (R₁₅)h fluorene [n] | Z1 | Ar9 | Ar10 |
|---|---|---|---|---|---|---|
| 401 | pyrene-CH₃ | Direct bond | 9,9-dimethylfluorene (dimethyl substituted) | Direct bond | phenyl | 9,9-dimethylfluorene |
| 402 | pyrene-CH₃ | Direct bond | 9,9-dimethylfluorene (dimethyl substituted) | Direct bond | phenyl | naphthyl |
| 403 | pyrene-CH₃ | Direct bond | 9,9-dimethylfluorene (dimethyl substituted) | Direct bond | p-tolyl | p-tolyl |

-continued
General formula [4]
| Compound No. | 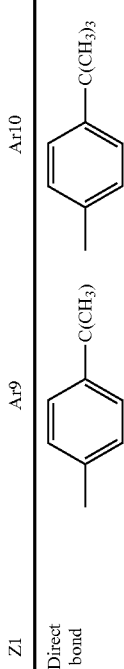 (R10)j | Z2 | 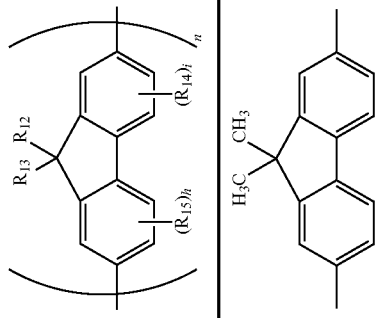 | Z1 | Ar9 | Ar10 |
|---|---|---|---|---|---|---|
| 404 | 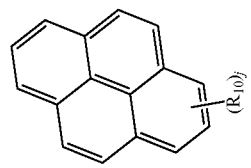 | Direct bond | 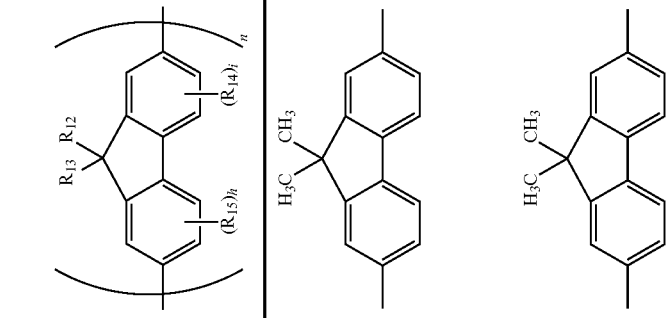 | Direct bond | C(CH$_3$)$_3$ (p-tBu-phenyl) | C(CH$_3$)$_3$ (p-tBu-phenyl) |
| 405 | 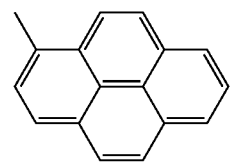 | Direct bond | | Direct bond | 3,5-dimethyl-4-methylphenyl | 1-naphthyl |
| 406 | 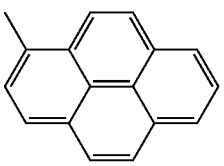 | Direct bond | | Direct bond | 3,5-dimethyl-4-methylphenyl | 3,5-dimethylphenyl |

-continued

General formula [4]

| Compound No. | (pyrene with R₁₀) | Z2 | fluorene with R₁₂,R₁₃,R₁₄,R₁₅ | Z1 | Ar9 | Ar10 |
|---|---|---|---|---|---|---|
| 407 | | Direct bond | | Direct bond | | |
| 408 | | Direct bond | | Direct bond | | |
| 409 | | Direct bond | | | | |

-continued

General formula [4]

| Compound No. | (R10)j [pyrene structure] | Z2 | R13 R12 / fluorene with (R14)i, (R15)h, n | Z1 | Ar9 | Ar10 |
|---|---|---|---|---|---|---|
| 410 | [methyl-pyrene] | Direct bond | [9,9-dimethylfluorene with two methyl groups] | [p-tolyl] | [phenyl] | [naphthyl] |
| 411 | [methyl-pyrene] | Direct bond | [bi(9,9-dimethylfluorene) with methyl groups] | [p-tolyl] | [phenyl] | [naphthyl] |
| 412 | [methyl-pyrene] | Direct bond | [9,9-dimethylfluorene with two methyl groups] | [p-tolyl] | [naphthyl] | [naphthyl] |

-continued

General formula [4]

| Compound No. | | Z2 | | Z1 | Ar9 | Ar10 |
|---|---|---|---|---|---|---|
| 413 | pyrene with R(10)j | Direct bond | fluorene with R12, R13, (R14)i, (R15)h, n | p-tolyl | mesityl (2,4,6-trimethylphenyl) | mesityl with CH3 groups |
| 414 | pyrene | Direct bond | 9,9-dimethyl-2,7-dimethylfluorene | m-tolyl | phenyl | 1-naphthyl |
| 415 | pyrene | Direct bond | 9,9-dimethyl-2,7-dimethylfluorene | m-tolyl | phenyl | phenyl |

-continued

General formula [4]

| Compound No. | (R_{10})j [pyrene core] | Z2 | [fluorene with R_{12},R_{13},R_{14}i,R_{15}h] | Z1 | Ar9 | Ar10 |
|---|---|---|---|---|---|---|
| 416 | methyl-pyrene | Direct bond | 9,9-dimethylfluorene (2,7-disubst.) | m-xylylene | o-tolyl | 1-naphthyl |
| 417 | methyl-pyrene | Direct bond | 9,9-dimethylfluorene (2,7-disubst.) | m-xylylene | 1-naphthyl | 1-naphthyl |
| 418 | methyl-pyrene | Direct bond | 9,9-dimethylfluorene (2,7-disubst.) | m-xylylene | 2,4,6-trimethylphenyl | 2,4,6-trimethylphenyl |

-continued

General formula [4]

| Compound No. | (pyrene with (R₁₀)j) | Z2 | fluorene with R₁₂,R₁₃,(R₁₄)i,(R₁₅)h | Z1 | Ar9 | Ar10 |
|---|---|---|---|---|---|---|
| 419 | pyrene | Direct bond | 9,9-dimethylfluorene (dimethyl-substituted) | m-xylyl | 4-fluorophenyl | 4-fluorophenyl |
| 420 | methyl-pyrene | Direct bond | bis(9,9-dimethylfluorene) with methyl | m-xylyl | 1-naphthyl | 1-naphthyl |
| 421 | methyl-pyrene | Direct bond | 9,9-dimethylfluorene (dimethyl-substituted) | 3,5-dimethylphenyl | phenyl | 1-naphthyl |

-continued

General formula [4]

| Compound No. | (pyrene with (R₁₀)ⱼ) | Z2 | fluorene with R₁₂,R₁₃,(R₁₄)ᵢ,(R₁₅)ₕ | Z1 | Ar9 | Ar10 |
|---|---|---|---|---|---|---|
| 422 | 1-substituted pyrene | Direct bond | 9,9-dimethylfluorene (2,7-linked) | 3,5-di-tert-butylphenyl (C(CH₃)₃, with methyl) | phenyl | 1-naphthyl |
| 423 | 1-substituted pyrene | Direct bond | 9,9-dimethylfluorene (2,7-linked) | 1,4-naphthyl (with methyls) | phenyl | phenyl |
| 424 | 1-substituted pyrene | Direct bond | 9,9-dimethylfluorene (2,7-linked) | 2,5-dimethylphenyl (CH₃, H₃C) | phenyl | 1-naphthyl |

-continued
General formula [4]
| Compound No. | 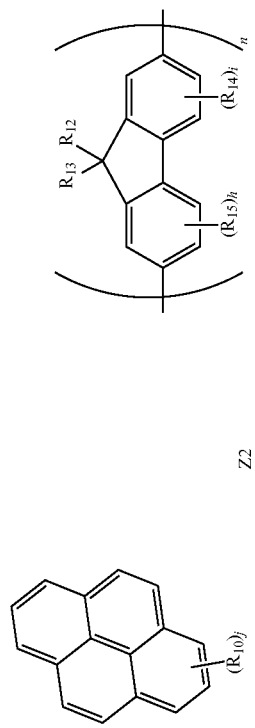 | Z2 | 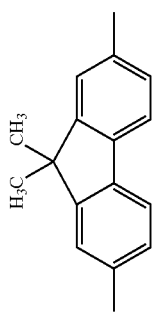 | Z1 | Ar9 | Ar10 |
|---|---|---|---|---|---|---|
| 425 | | Direct bond | | | | |
| 426 | | | | | | |
| 427 | | | | | | |

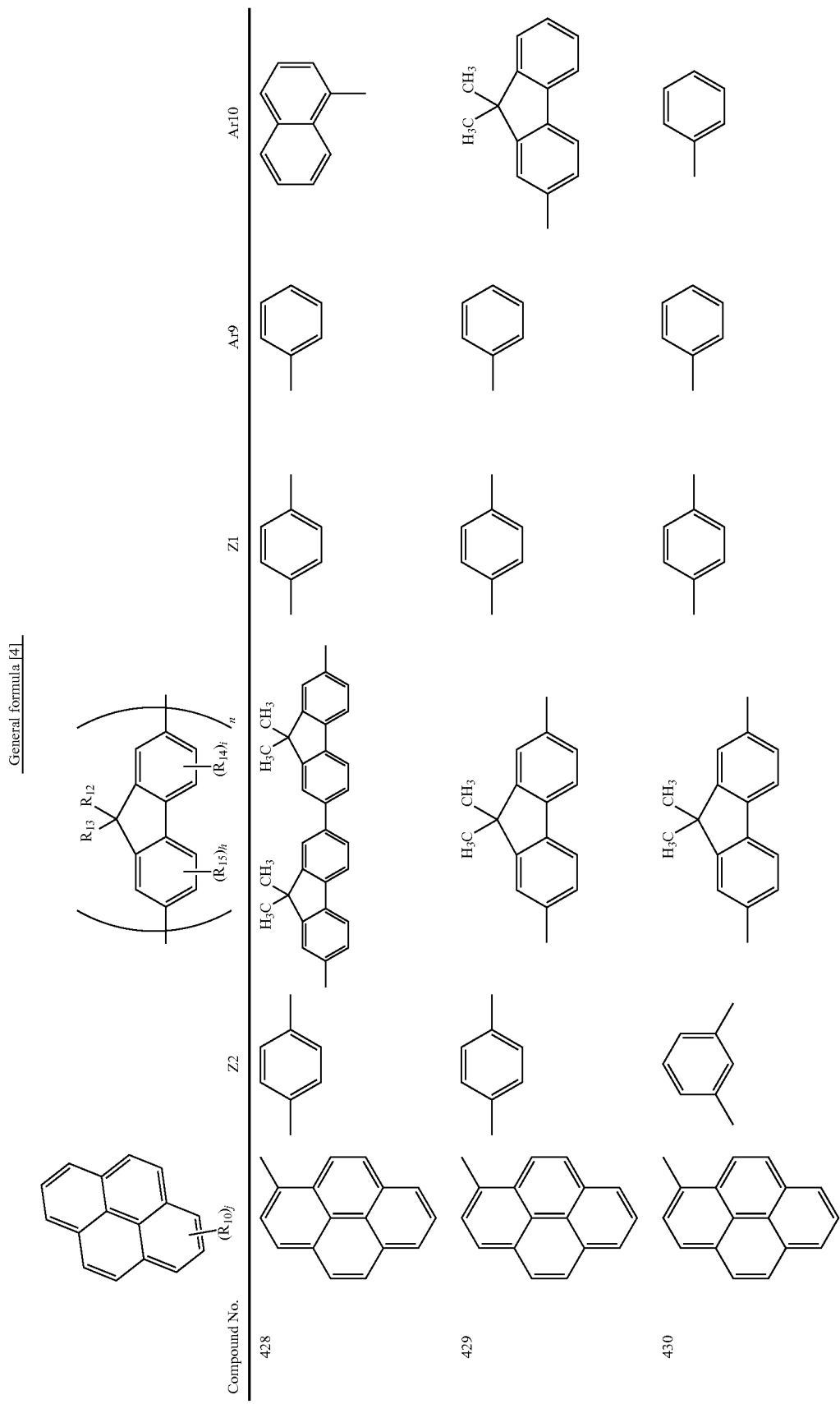

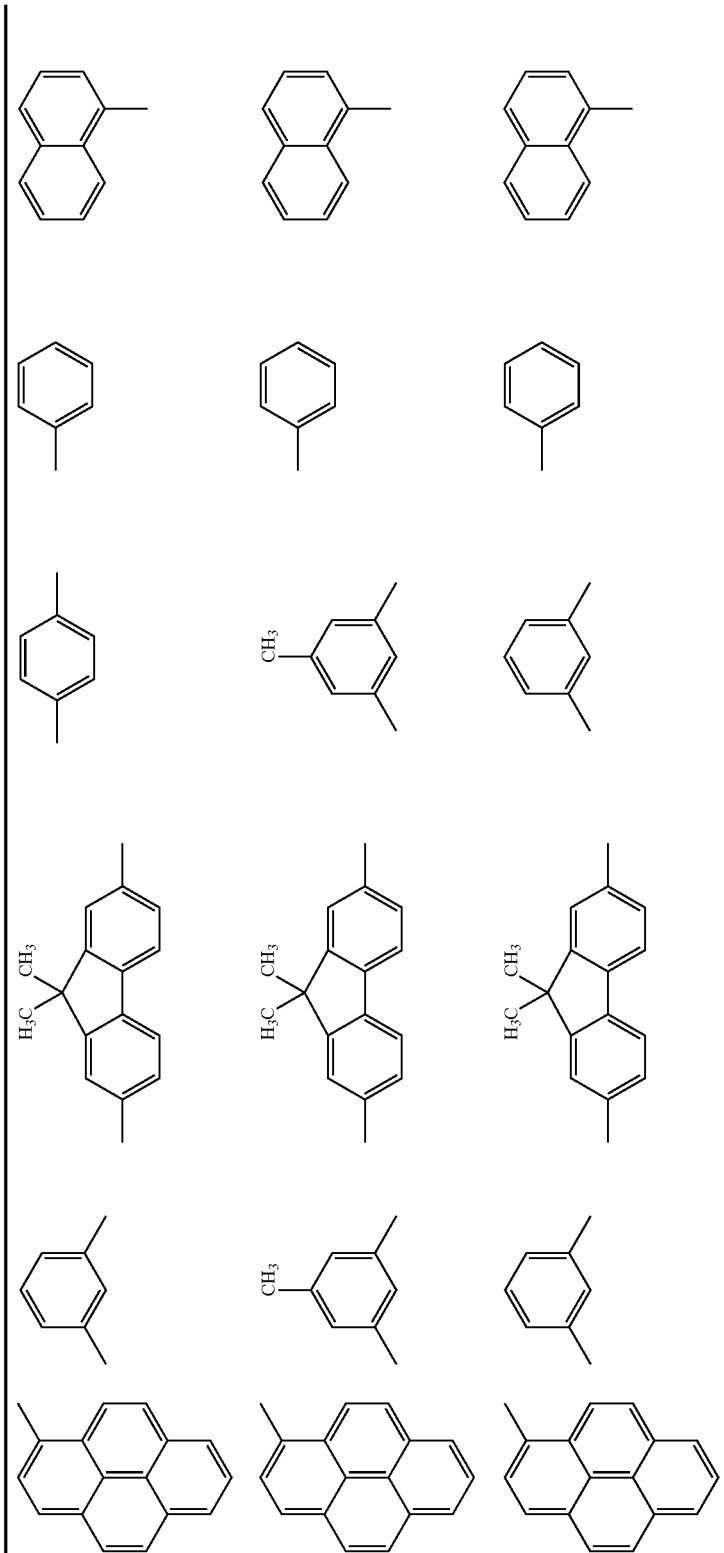

-continued

General formula [4]

| Compound No. | (R10)j [pyrene] | Z2 | R13 R12 / (R14)i / (R15)h fluorene (n) | Z1 | Ar9 | Ar10 |
|---|---|---|---|---|---|---|
| 434 | [methyl-pyrene-tBu] | Direct bond | [9,9-dimethyl-2,7-dimethylfluorene] | Direct bond | [toluene] | [naphthalene-methyl] |
| 435 | [Me, methyl-pyrene-tBu] | Direct bond | [9,9-dimethyl-2,7-dimethylfluorene] | Direct bond | [C(CH3)3-phenyl] | [C(CH3)3-phenyl] |

-continued

General formula [4]

| Compound No. | (R₁₀)j [pyrene structure] | Z2 | R₁₃ R₁₂ / fluorene with (R₁₄)i and (R₁₅)h, n | Z1 | Ar9 | Ar10 |
|---|---|---|---|---|---|---|
| 436 | methyl-pyrene-t-Bu | Direct bond | 2,7-dimethyl-9,9-dimethylfluorene | m-xylylene | 4-(C(CH₃)₃)phenyl | 2,6-dimethylnaphthalene |
| 437 | methyl-pyrene-t-Bu | Direct bond | 2,7-dimethyl-9,9-dimethylfluorene | m-xylylene | 4-(C(CH₃)₃)phenyl | 1-naphthyl |

-continued
General formula [4]
| Compound No. | | Z2 | 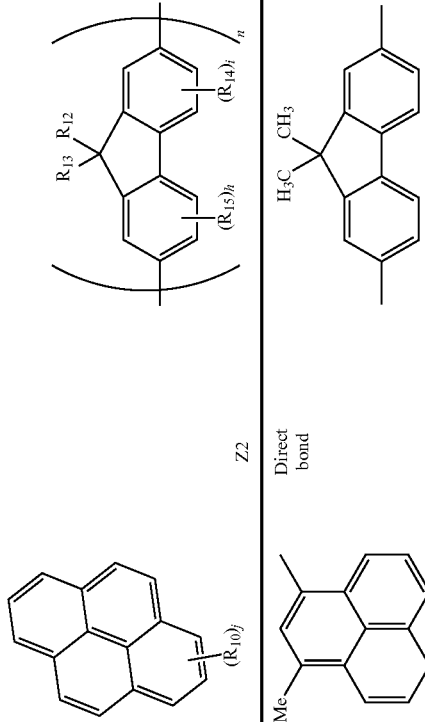 | Z1 | Ar9 | Ar10 |
|---|---|---|---|---|---|---|
| 438 | 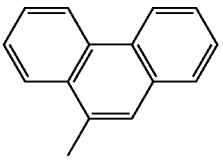 | Direct bond | 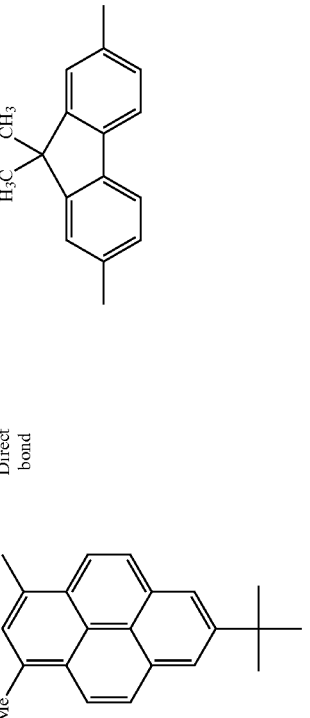 | 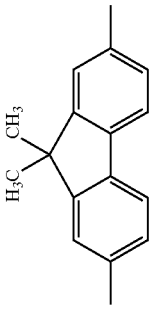 | 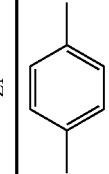 | 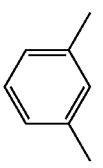 |
| 439 | 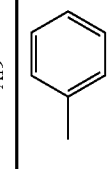 | Direct bond | 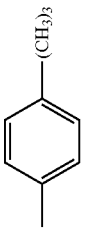 |  | 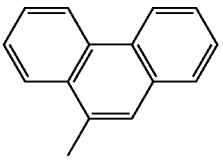 | |

-continued

General formula [4]

| Compound No. | (R₁₀)j [pyrene] | Z2 | R₁₃ R₁₂ / (R₁₄)i / (R₁₅)h fluorene (n) | Z1 | Ar9 | Ar10 |
|---|---|---|---|---|---|---|
| 440 | pyrenyl | 1,3-phenylene | 2,7-(9,9-dimethylfluorene) | 1,4-phenylene | phenyl | 1-naphthyl |
| 441 | pyrenyl | 1,3-phenylene | 2,7-(9,9-dimethylfluorene) | 1,4-phenylene | phenyl | 1-naphthyl |
| 442 | pyrenyl | Direct bond | 2,7-(9,9-diphenylfluorene) | Direct bond | phenyl | phenanthryl |

-continued

General formula [4]

| Compound No. | (pyrene with R₁₀) | Z2 | fluorene with R₁₂,R₁₃,R₁₄,R₁₅ | Z1 | Ar9 | Ar10 |
|---|---|---|---|---|---|---|
| 443 | 1-Me, 6-Me, 8-tBu pyrene | Direct bond | 2,7-dimethyl-9,9-dimethylfluorene | Direct bond | p-tolyl | 2-methylnaphthyl |
| 444 | 1-Me, 7-tBu pyrene | Direct bond | 2,7-dimethyl-9,9-dimethylfluorene | Direct bond | 4-tert-butylphenyl | 4-tert-butylphenyl |

-continued

General formula [4]

| Compound No. | (pyrene with (R10)j) | Z2 | fluorene core with R12 R13, (R14)i, (R15)h, n | Z1 | Ar9 | Ar10 |
|---|---|---|---|---|---|---|
| 445 | pyrene | 3,5-dimethylphenyl (CH3) | 9,9-dimethylfluorene with methyl substituents | Direct bond | phenyl | 2-naphthyl |
| 446 | pyrene | 3,5-dimethylphenyl (CH3) | 9,9-dimethylfluorene with methyl substituents | Direct bond | phenyl | 1-naphthyl |
| 447 | pyrene | 3,5-dimethylphenyl (CH3) | 9,9-dimethylfluorene with methyl substituents | Direct bond | p-tolyl (CH3) | p-tolyl (CH3) |

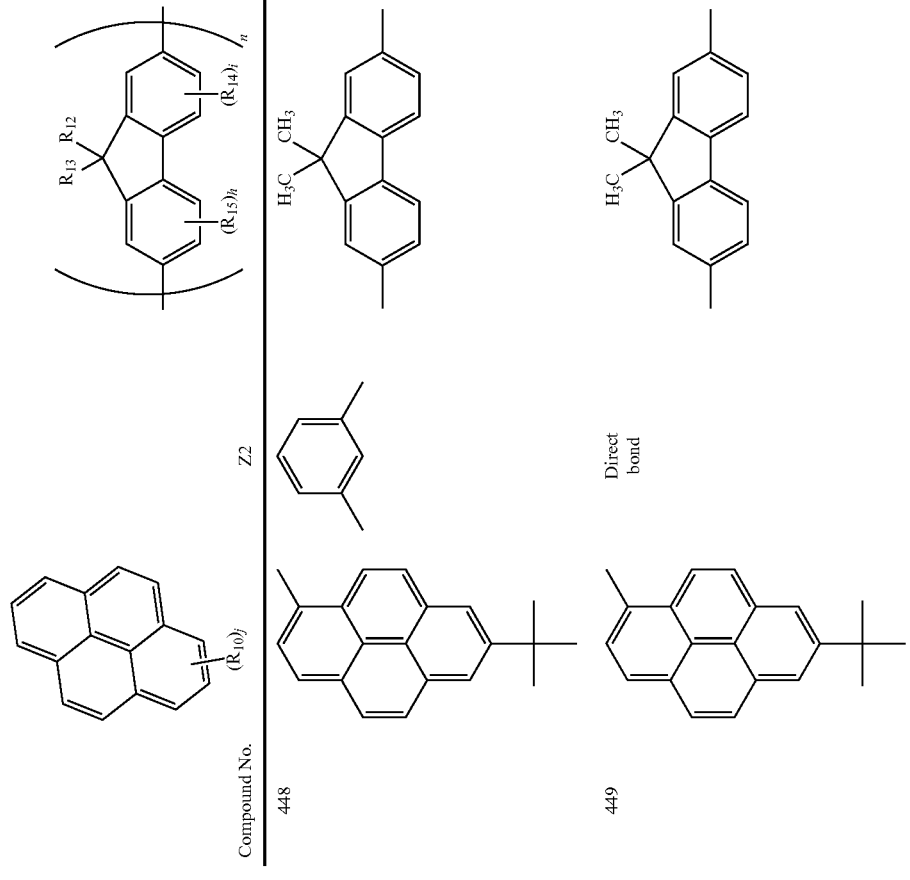

-continued
General formula [4]
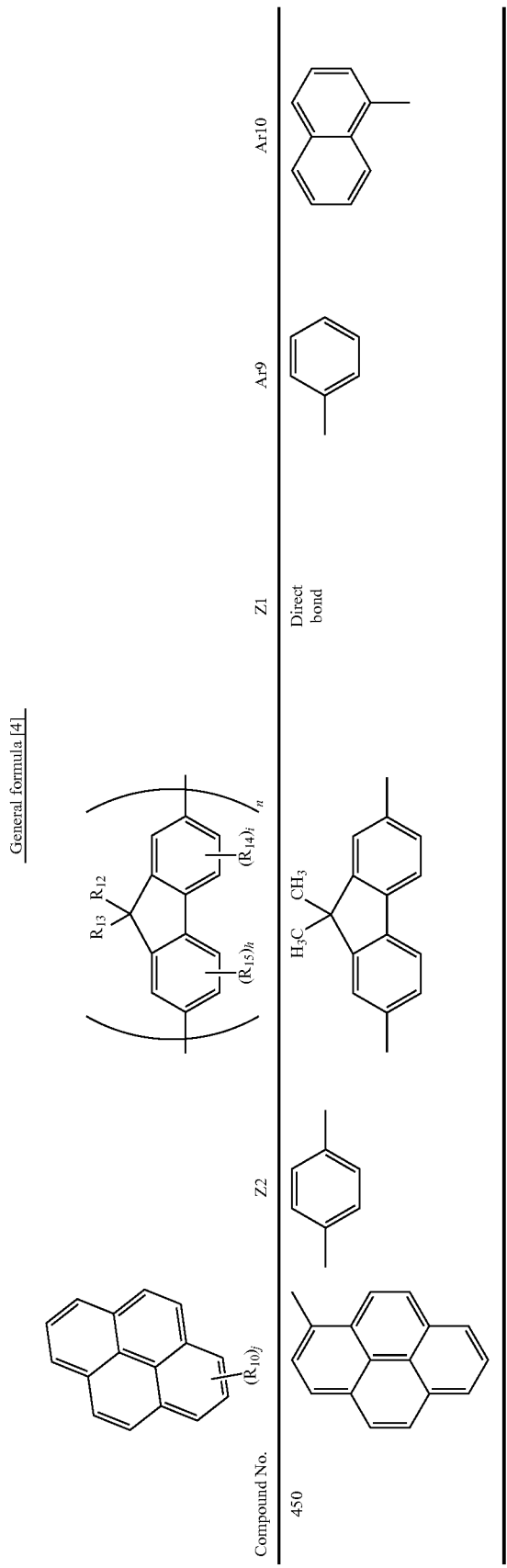
| Compound No. | Z2 | | Z1 | Ar9 | Ar10 |
|---|---|---|---|---|---|
| 450 | | | Direct bond | | |

General formula [5]
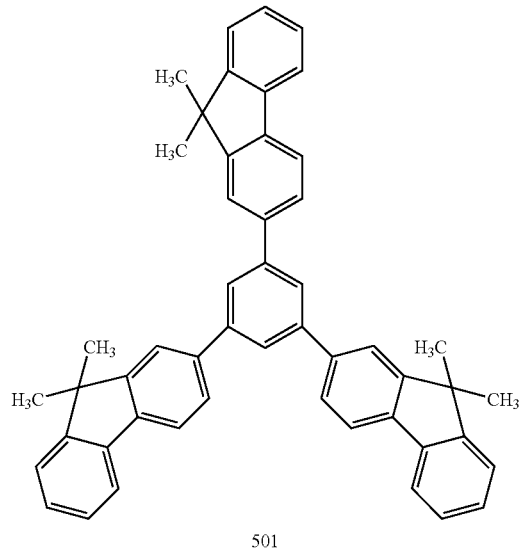
501
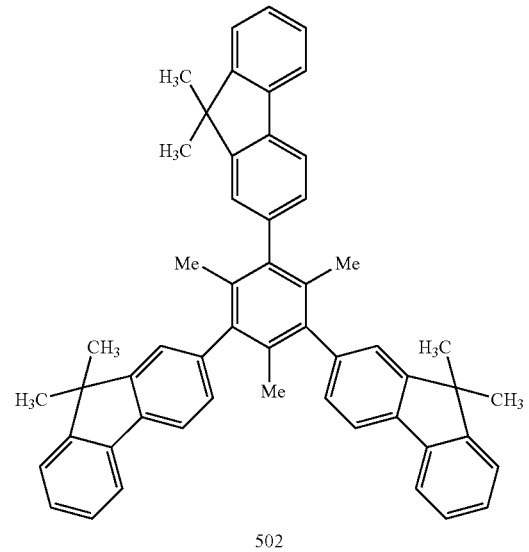
502
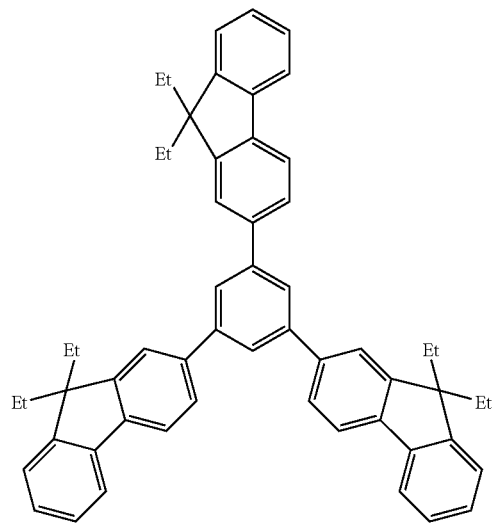
503
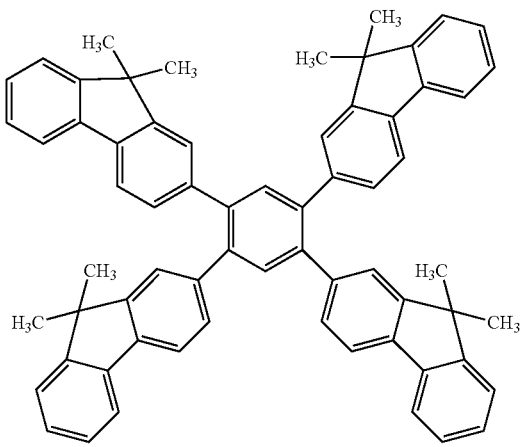
504

-continued
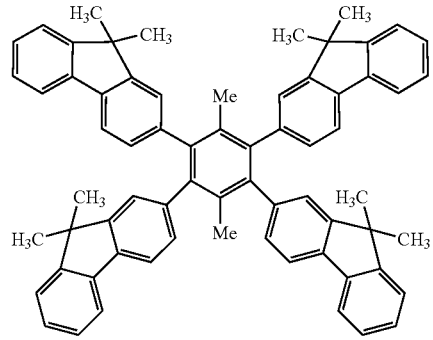
505
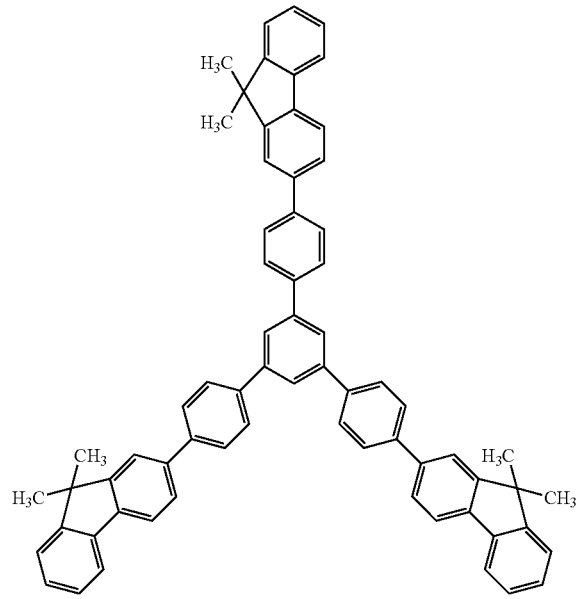
506
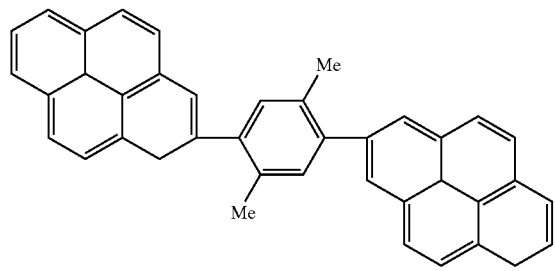
507
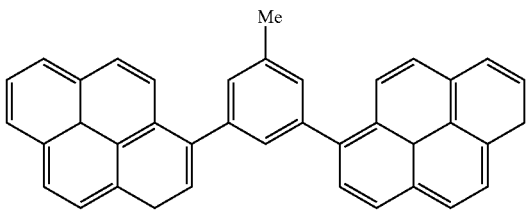
508
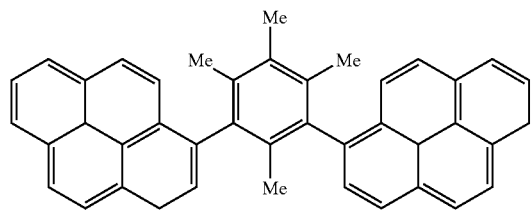
509
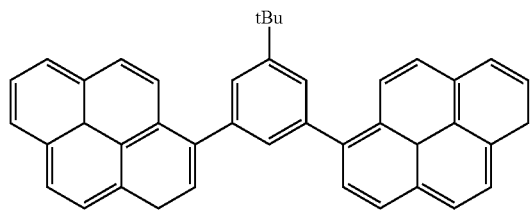
510
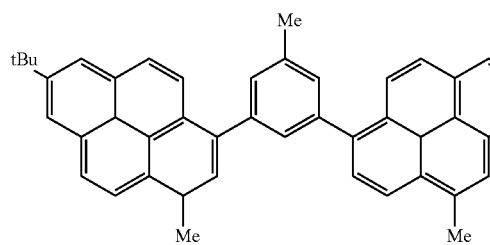
511
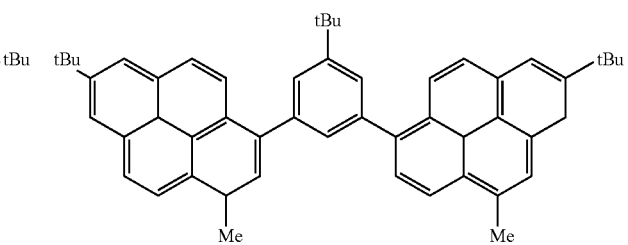
512

-continued
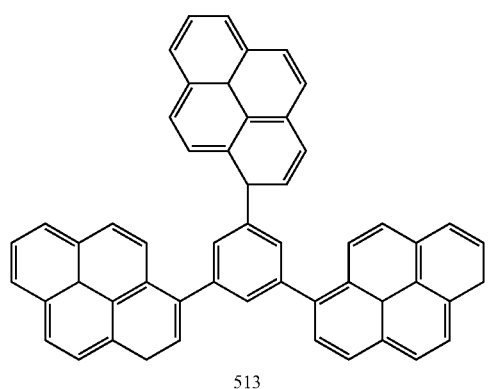
513
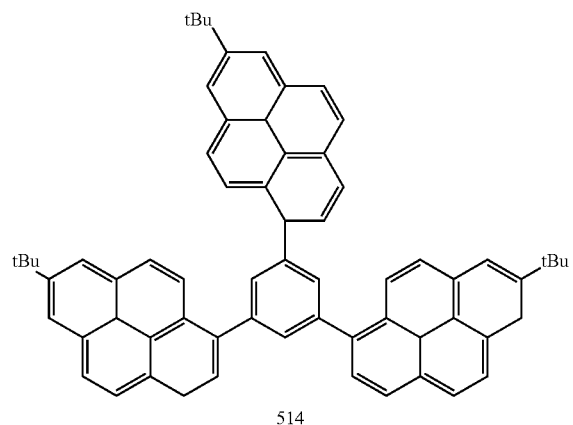
514
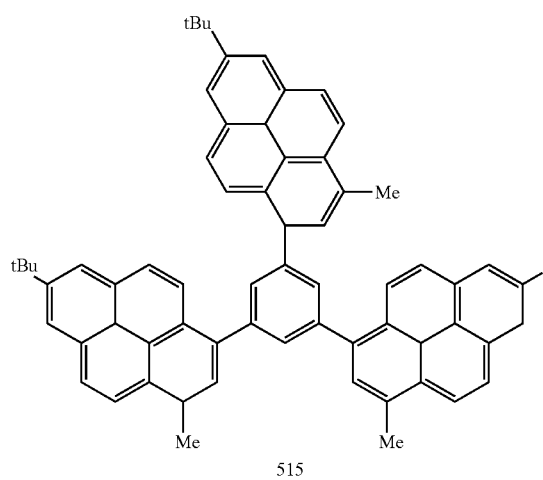
515
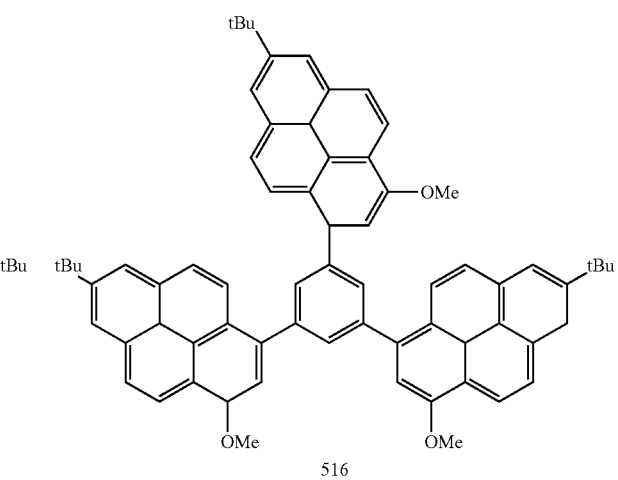
516
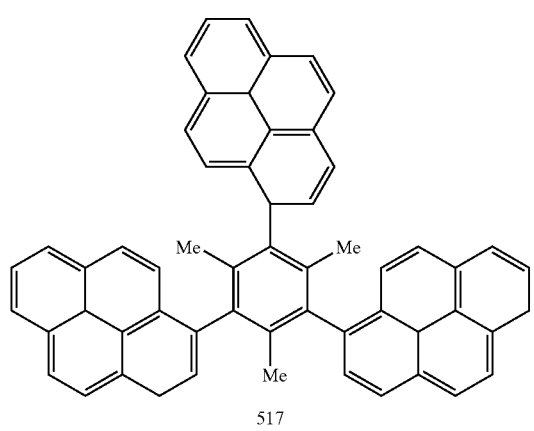
517
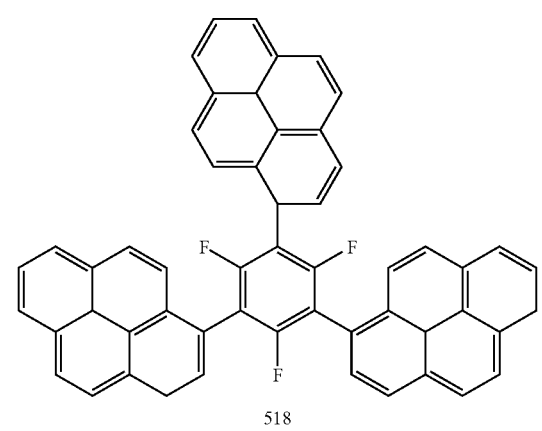
518

-continued
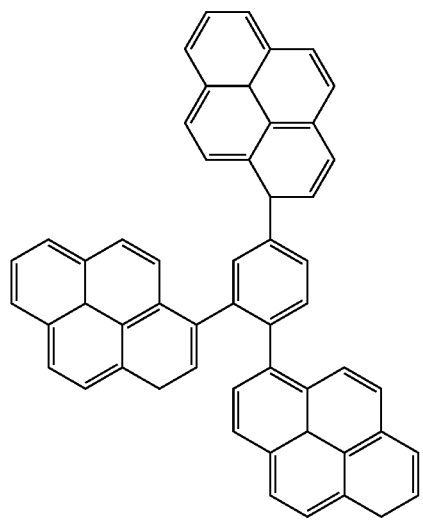
519
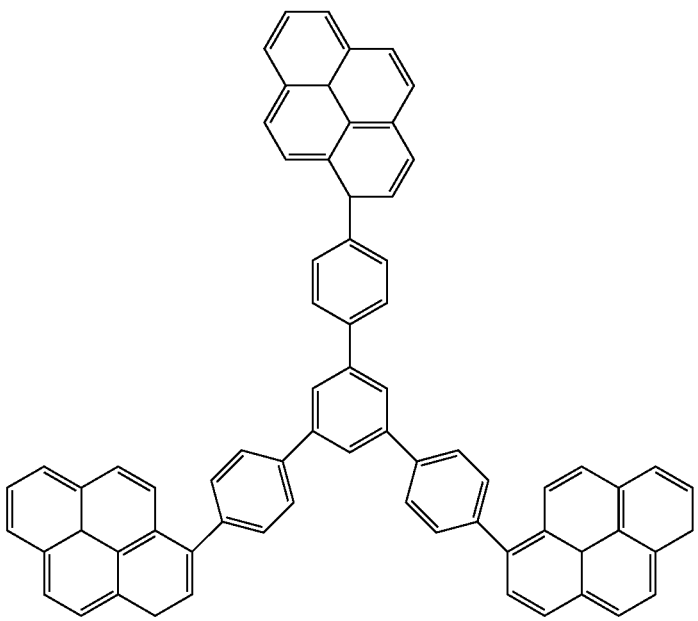
520
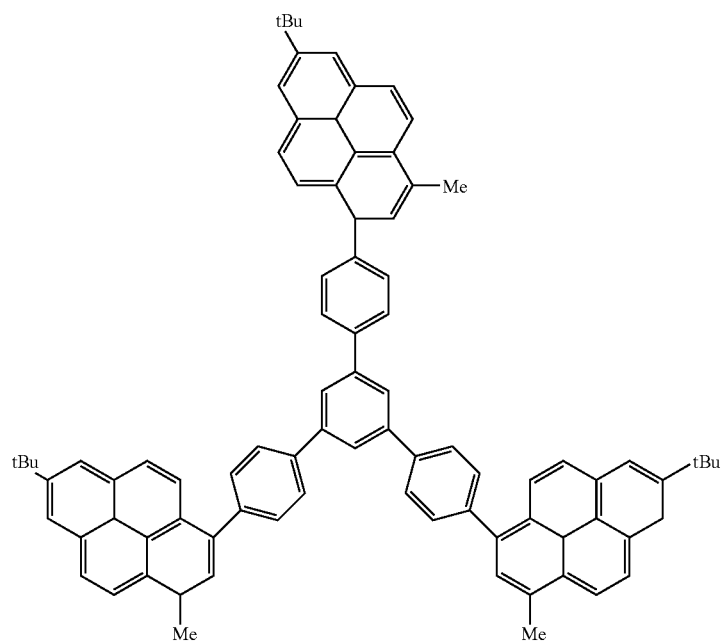
521

-continued
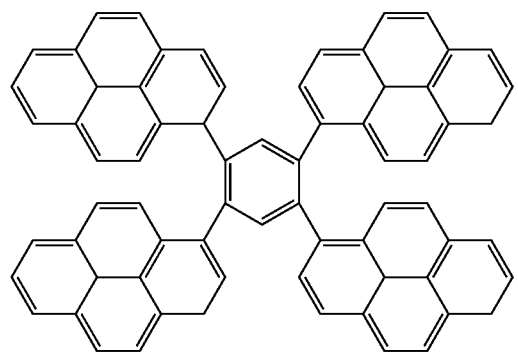
522
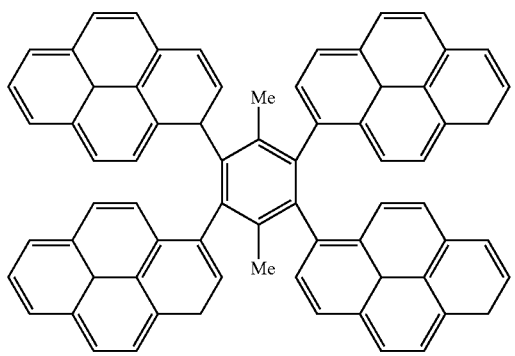
523
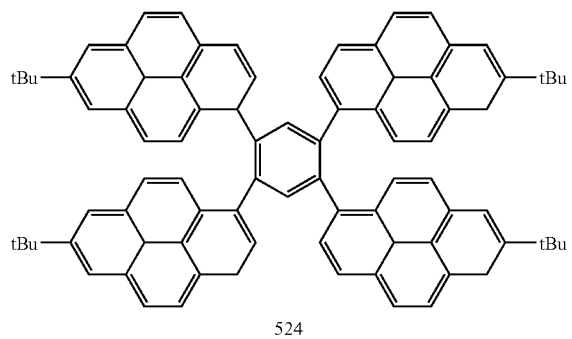
524
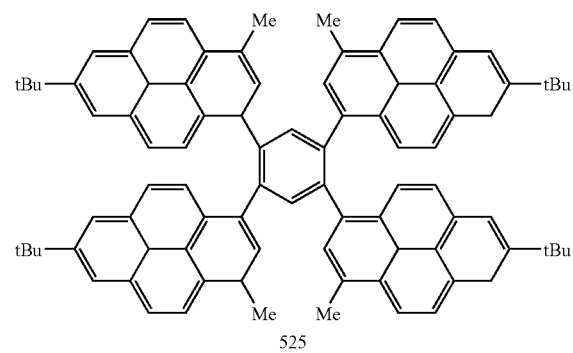
525
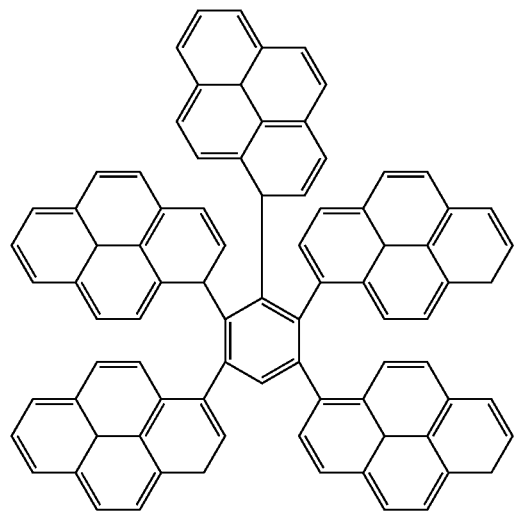
526
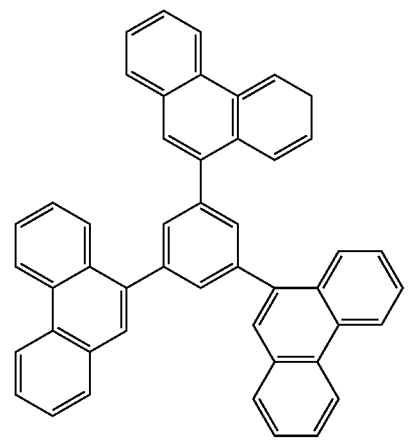
527

-continued
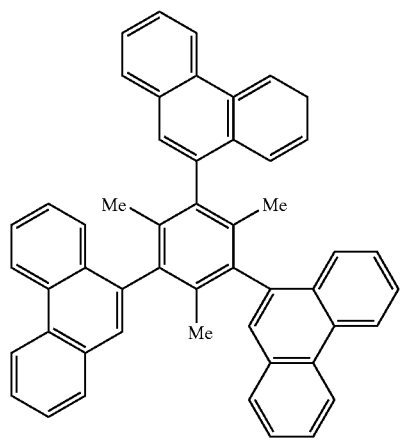
528
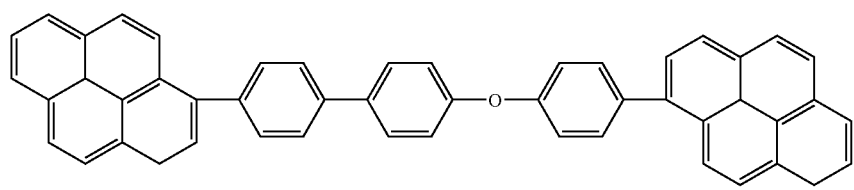
529
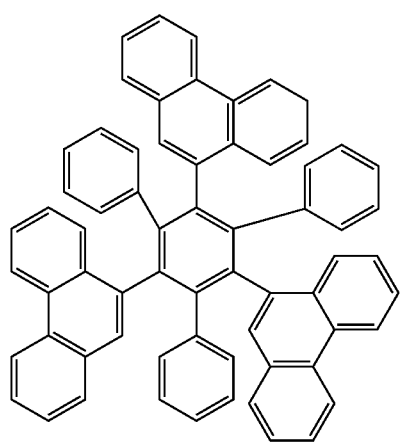
530
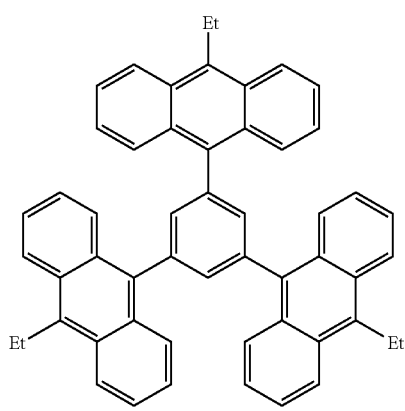
531

-continued

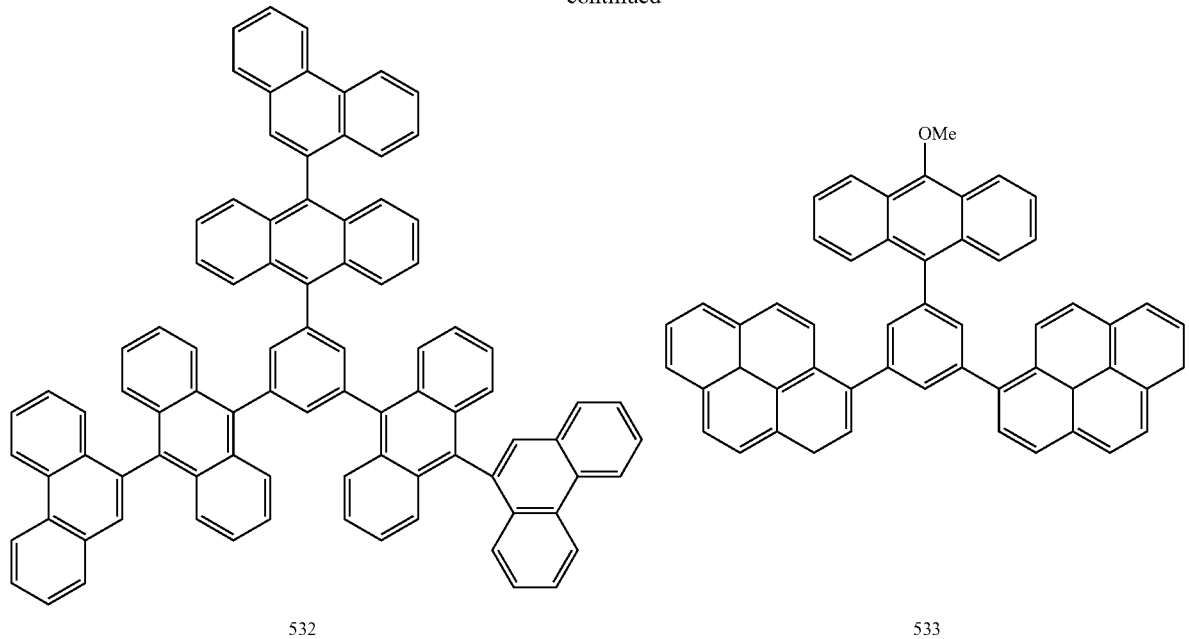

532

533

Next, an organic light-emitting device of the present invention will be described in detail.

The organic light-emitting device of the present invention includes: a pair of electrodes composed of an anode and a cathode; and an organic compound layer held between the pair of electrodes. In the organic light-emitting device, the organic compound layer, preferably a light-emitting layer contains at least one of the above-mentioned silyl compounds.

FIGS. 1 to 5 show preferable examples of the organic light-emitting device of the present invention. First, each reference numeral will be described.

Reference numeral 1 denotes a substrate; 2, an anode; 3, a light-emitting layer; 4, a cathode; 5, a hole transport layer; 6, an electron transport layer; 7, a hole injection layer; and 8, a hole/exciton blocking layer.

FIG. 1 is a sectional view showing an example of an organic light-emitting device according to the present invention. As shown in FIG. 1, the organic light-emitting device has a structure in which an anode 2, a light-emitting layer 3, and a cathode 4 are provided on a substrate 1 in this order. This light-emitting device used herein is useful in the case where, when the device itself includes a single layer having a hole-transporting property, electron-transporting property, and the other light-emitting properties, the mixture of organic compounds having the respective properties are used in the light-emitting layer.

Figure 2:
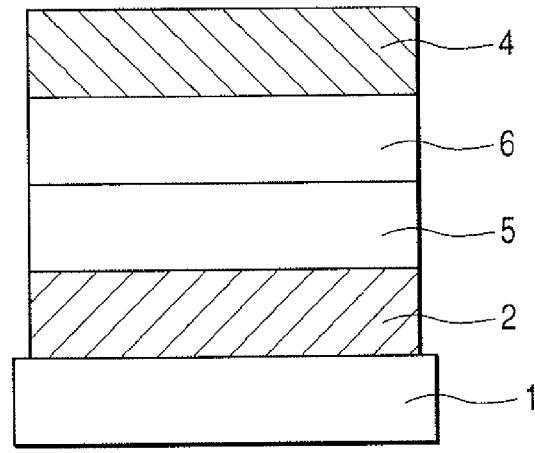
FIG. 2 is a sectional view showing another example of the organic light-emitting device according to the present invention.

FIG. 2 is a sectional view showing another example of the organic light-emitting device according to the present invention. As shown in FIG. 2, the organic light-emitting device has a structure in which the anode 2, a hole transport layer 5, an electron transport layer 6, and the cathode 4 are provided on the substrate 1 in this order. This light-emitting substance is useful in the case where a material having one or both of hole-transporting property and electron-transporting property is used for each layer, and the light-emitting substance is used in combination with a non-illuminant hole-transporting substance or electron-transporting substance. In this case, the light-emitting layer is formed of the hole transport layer 5 or the electron transport layer 6.

Figure 3:
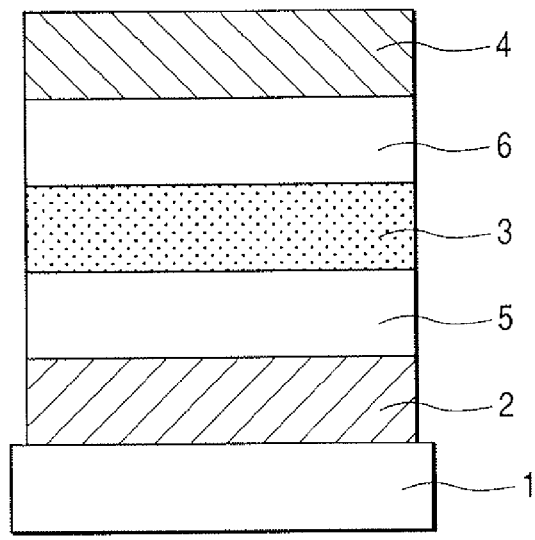
FIG. 3 is a sectional view showing still another example of the organic light-emitting device according to the present invention.

FIG. 3 is a sectional view showing still another example of the organic light-emitting device according to the present invention. As shown in FIG. 3, the organic light-emitting device has a structure in which the anode 2, the hole transport layer 5, the light-emitting layer 3, the electron transport layer 6, and the cathode 4 are provided on the substrate 1 in this order. This organic light-emitting device has separate carrier-transporting function and light-emitting function. The device is used in combination with compounds each having hole-transporting property, electron-transporting property, or light-emitting property as appropriate, thereby allowing a substantial increase in freedom of choice in material to be used. Further, various compounds having different emission wavelengths can be used, thereby allowing an increase in variety of luminescent colors. Further, luminous efficiency may be improved by efficiently confining each carrier or exciton in the light-emitting layer 3 provided in the middle of the device.

Figure 4:
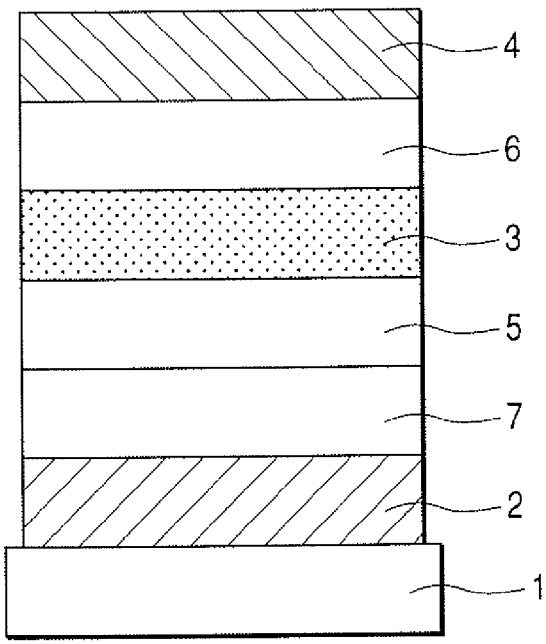
FIG. 4 is a sectional view showing yet another example of the organic light-emitting device according to of the present invention.

FIG. 4 is a sectional view showing yet another example of the organic light-emitting device according to the present invention. FIG. 4 has the same structure shown in FIG. 3 except that a hole-injecting layer 7 is inserted into the side of the anode 2. This structure is effective for improving adhesiveness between the anode 2 and the hole transport layer 5 or for improving hole-injecting property, which is effective in lowering a voltage to be applied to the device.

Figure 5:
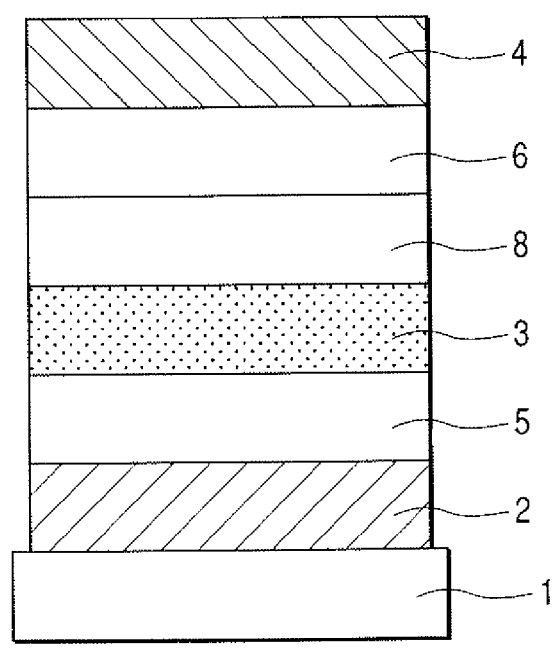
FIG. 5 is a sectional view showing still yet another example of the organic light-emitting device according to the present invention.

FIG. 5 is a sectional view showing still yet another example of the organic light-emitting device according to the present invention. FIG. 5 has the same structure shown in FIG. 3 except that a layer (hole/exciton-blocking layer 8) for blocking travel of a hole or exciton to the side of the cathode 4 is inserted between the light-emitting layer 3 and the electron transport layer 6. This structure uses a compound having an extremely high ionization potential for the hole/exciton-blocking layer 8 and is effective for improving luminous efficiency.

However, FIGS. 1 to 5 show basic device structures, and the structure of the organic light-emitting device using the silyl compound of the present invention is not limited to the structures shown in FIGS. 1 to 5. For example, the organic light-emitting device of the present invention may have any one of various layer structures including: a structure in which an insulating layer is provided at an interface between an electrode and an organic layer; a structure in which an adhesive layer or an interference layer is provided; and a structure in which a hole transport layer is composed of two layers with different ionization potentials.

The organic light-emitting device of the present invention may be used for any one of the structures shown in FIGS. 1 to 5.

In particular, an organic layer using the silyl compound of the present invention is useful as a light-emitting layer, an electron transport layer, or a hole transport layer. In addition, a layer formed by a vacuum deposition method, a solution coating method, or the like is hardly crystallized and has excellent stability with the elapse of time.

In the present invention, the silyl compound is used particularly as a component of the light-emitting layer. A conventionally known additive compound such as a low-molecular-weight-based or polymer-based hole transportable compound, luminescent compound, or electron transportable compound can be used together as required. When these compound is used as a host material or an auxiliary dopant, the blend amount of those compounds may be in the range of 0.01 wt % or more and less than 100 wt % with respect to the total of the components of the light-emitting layer.

Examples of the compounds will be shown below.

A preferred hole-injection transporting material has excellent mobility for facilitating injection of a hole from an anode and for transporting the injected hole to a light-emitting layer. Examples of a low molecular weight or polymer material having hole-injection transporting property include, but are not limited to, a triarylamine derivative; a phenylenediamine derivative; a triazole derivative; an oxadiazole derivative; an imidazole derivative; a pyrazoline derivative; a pyrazolone derivative; an oxazole derivative; a fluorenone derivative; a hydrazone derivative; a stilbene derivative; a phthalocyanine derivative; a porphyrin derivative; poly(vinylcarbazole); poly(silylene); poly(thiophene); and other conductive polymers.

Examples of a material which is mainly involved in a light-emitting function other than the silyl compound to be used in the organic light-emitting device of the present invention include, but are not limited to, a polycyclic condensed aromatic compound (including a naphthalene derivative, a phenanthrene derivative, a fluorene derivative, a pyrene derivative, a tetracene derivative, a coronene derivative, a chrysene derivative, a perylene derivative, a 9,10-diphenylanthracene derivative, or rubrene); a quinacridone derivative; an acridone derivative; a coumarin derivative; a pyran derivative; Nile red; a pyrazine derivative; a benzoimidazole derivative; a benzothiazole derivative; a benzoxazole derivative; a stilbene derivative; an organometallic complex (including: an organic aluminum complex such as tris(8-quinolinolato)aluminum; or an organic beryllium complex); and a polymer derivative (including a poly(phenylene vinylene)derivative, a poly(fluorene) derivative, a poly(phenylene) derivative, a poly(thienylene vinylene)derivative, or a poly(acetylene) derivative).

The electron-injection transporting material may be arbitrarily selected from materials which facilitate injection of an electron from a cathode and which have a function of transporting the injected electron into a light-emitting layer. The material is selected in consideration of, for example, the balance with the mobility of a carrier of the hole transport material. Examples of a material having electron-injection transporting property include, but are not limited to, an oxadiazole derivative, an oxazole derivative, a thiazole derivative, a thiadiazole derivative, a pyrazine derivative, a triazole derivative, a triazine derivative, a perylene derivative, a quinoline derivative, a quinoxaline derivative, a fluorenone derivative, an anthrone derivative, a phenanthroline derivative, and an organometallic complex.

In the organic light-emitting device according to the present invention, the layer containing the silyl compound of the present invention and layers containing other organic compounds are each formed by the following method. A thin film is generally formed by a vacuum vapor deposition method, an ionized vapor deposition method, sputtering, plasma, or a known coating method (such as a spin coating, dipping, casting, LB, or ink jet method) in which a compound is dissolved in an appropriate solvent. In film formation by a coating method, in particular, a film may be formed by using a compound in combination with an appropriate binder resin.

The binder resin may be selected from a wide variety of binder resins. Examples of the binder resin include, but not limited to, a polyvinyl carbazole resin; a polycarbonate resin; a polyester resin; a polyallylate resin; a polystyrene resin; an ABS resin; a polybutadine resin; a polyurethane resin; an acrylic resin; a methacrylic resin; a butyral resin; a polyvinyl acetal resin; a polyamide resin; a polyimide resin; a polyethylene resin; a polyethersulfone resin; a diallyl phthalate resin; a phenol resin; an epoxy resin; a silicone resin; a polysulfone resin; and a urea resin. One kind of binder resin may be used alone, or two or more kinds thereof may be mixed and used as a copolymer. Further, an additive such as a known plasticizer, antioxidant, or ultraviolet absorber may be used in combination as required.

An anode material preferably has as large a work function as possible, and examples thereof include: a metal element such as gold, platinum, silver, copper, nickel, palladium, cobalt, selenium, vanadium, or tungsten; an alloy thereof; and a metal oxide such as tin oxide, zinc oxide, indium oxide, indium tin oxide (ITO), or indium zinc oxide. Further, a conductive polymer such as polyaniline, polypyrrole, polythiophene, or polyphenylene sulfide may also be used. Each of those electrode materials may be used alone, or two or more kinds thereof may be used in combination. Further, the anode may have a single layer structure or a multilayer structure.

Meanwhile, a cathode material preferably has a small work function, and examples thereof include: a metal element such as lithium, sodium, potassium, calcium, magnesium, aluminum, indium, ruthenium, titanium, manganese, yttrium, silver, lead, tin, or chromium; and an alloy thereof such as a lithium-indium alloy, a sodium-potassium alloy, a magnesium-silver alloy, an aluminum-lithium alloy, an aluminum-magnesium alloy, or a magnesium-indium alloy. A metal oxide such as indium tin oxide (ITO) may also be used. Each of those electrode materials may be used alone, or two or more kinds thereof may be used in combination. Further, the cathode may have a single layer structure or a multilayer structure.

The substrate to be used in the present invention is not particularly limited, but examples thereof include: an opaque substrate such as a metal substrate or a ceramics substrate; and a transparent substrate such as a glass substrate, a quartz substrate, or a plastic sheet substrate. In addition, the substrate may have a color filter film, a fluorescent color converting filter film, a dielectric reflection film, or the like for controlling luminescent color.

Further, a protective layer or a sealing layer may be formed on the produced device to prevent contact between the device and oxygen, moisture, or the like. Examples of the protective layer include: a diamond thin film; a film formed of an inorganic material such as metal oxide or metal nitride; a polymer film formed of a fluorine resin, polyparaxylene, polyethylene, a silicone resin, a polystyrene resin, or the like; and a photocurable resin. Further, the device itself may be covered with glass, a non-gas-transmissive film, a metal, or the like and packaged with an appropriate sealing resin.

A thin film transistor (TFT) may be produced on a substrate, and then the device of the present invention may be produced to be connected to TFT.

Regarding the emission direction of a device, the device may have a bottom emission structure (structure of emitting light from a substrate side) or a top emission structure (structure of emitting from an opposite side of the substrate).

Hereinafter, the present invention will be described more specifically with reference to examples, but the present invention is not limited to the examples.

EXAMPLE 1

An organic light-emitting device having the structure shown in FIG. 3 was produced by the method described below.

Indium tin oxide (ITO) as the anode 2 was sputtered to form a film having a thickness of 120 nm on a glass substrate as the substrate 1 by a sputtering method, and the obtained substrate was used as a transparent conductive supporting substrate. The obtained substrate was subjected to ultrasonic cleaning in acetone and isopropyl alcohol (IPA) in this order. Then, the substrate was cleaned in boiling IPA and dried. The substrate was further subjected to UV/ozone cleaning to be used as a transparent conductive supporting substrate.

A chloroform solution containing 0.2 wt % of a compound represented by the following structural formula as a hole transport material was prepared.

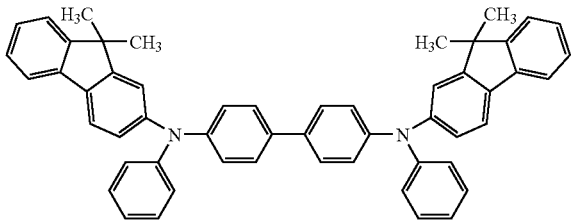

While this solution was dropped onto the above-mentioned ITO electrode, spin coating was performed at a revolving speed of 500 rpm for 10 seconds at first and then at a revolving speed of 1,000 rpm for 1 minute to form a film on the ITO electrode. Then, the substrate having the film was dried in a vacuum oven at 80° C. for 10 minutes, to thereby completely remove the solvent in the thin film. The thus-formed hole transport layer 5 had a thickness of 25 nm.

Next, as the light-emitting layer 3, Exemplified Compound No. 106 described above was vapor-deposited on the hole transport layer 5. The resultant light-emitting layer 3 had a thickness of 20 nm. A degree of vacuum during vapor deposition was $1.0 \times 10^{-4}$ Pa and a film formation rate was 0.2 to 0.3 nm/second.

Further, an electron transport layer 6 of 2,9-[2-(9,9'-dimethylfluorenyl)]-1,10-phenanthroline was formed into a film having a thickness of 50 nm through a vacuum vapor deposition method. A degree of vacuum during vapor deposition was $1.0 \times 10^{-4}$ Pa and a film formation rate was 0.2 to 0.3 nm/second.

Next, lithium fluoride (LiF) was formed into a film having a thickness of 0.5 nm on the electron transport layer 6 by a vacuum deposition method, and an aluminum film having a thickness of 150 nm was formed thereon through a vacuum vapor deposition method, to thereby form an electron-injection electrode (cathode 4). As a result, an organic light-emitting device was produced. A degree of vacuum during deposition was $1.0 \times 10^{-4}$ Pa. The formation rate of the lithium fluoride film was 0.05 nm/second, and the formation rate of the aluminum film was 1.0 to 1.2 nm/second.

The obtained organic light-emitting device was covered with a protective glass and sealed with an acrylic resin-based adhesive material in a dry air atmosphere to prevent degradation of the device by adsorption of moisture thereon.

Under application of a voltage of 4 V to the thus-obtained device having the ITO electrode (anode 2) as a positive electrode and the Al electrode (cathode 4) as a negative electrode, green light emission with an emission luminance of 380 cd/m$^2$ and a luminous efficiency of 6.0 lm/W was observed.

Further, the voltage was applied to the device for 100 hours while a current density was maintained at 30 mA/cm2 in a nitrogen atmosphere, resulting in slight luminance degradation from an initial luminance of 580 cd/m$^2$ to a luminance of 500 cd/m$^2$ after 100 hours.

EXAMPLES 2 TO 5

Organic light-emitting devices were produced in the same manner as in Example 1 and were subjected to the same evaluation except that the compounds shown in Table 1 were used instead of Exemplified Compound No. 106. Table 1 shows the results.

TABLE 1

| Example | Exemplified Compound No. | Applied voltage (V) | Luminance (cd/m$^2$) | Efficiency (lm/W) |
|---|---|---|---|---|
| 2 | 110 | 4.0 | 440 | 6.9 |
| 3 | 111 | 4.0 | 550 | 7.1 |
| 4 | 119 | 4.0 | 570 | 7.4 |
| 5 | 132 | 4.0 | 590 | 7.7 |

COMPARATIVE EXAMPLE 1

An organic light-emitting device was produced in the same manner as in Example 1 and was subjected to the same evaluation except that the following comparative compound 1 was used instead of Exemplified Compound No. 106.

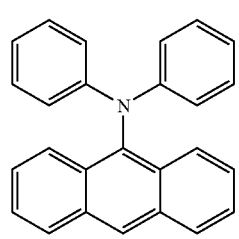

Comparative Compound 1

Under application of a voltage of 4 V, green light emission with an emission luminance of 320 cd/m$^2$ and a luminous efficiency of 1.9 lm/W was observed. Further, when the voltage was applied to the device for 100 hours while a current density was maintained at 30 mA/cm$^2$ in a nitrogen atmosphere, a luminance change from an initial luminance of 490 cd/m$^2$ to a luminance of 230 cd/m$^2$ after 100 hours was observed.

EXAMPLES 6 TO 16

Next, devices were each produced in the same manner as in Example 1 except that the first compound shown in Table 2 as a dopant material and the second compound shown in Table 2 as a host material were co-deposited to provide a light-emitting layer having a thickness of 20 nm as the light-emitting layer 3. The devices were each evaluated in the same manner as in Example 1. Table 2 shows the results.

In addition, a voltage was applied to the device produced in Example 7 for 100 hours under a nitrogen atmosphere while a current density was kept at 30 mA/cm$^2$. As a result, an initial luminance of 2,290 cd/m$^2$ reduced to 1990 cd/m$^2$ after 100 hours. This result means that luminance deterioration was small.

TABLE 2

| Example | First compound No. | Second compound No. | Co-deposition ratio Compound 1:Compound 2 | Applied voltage (V) | Luminance (cd/m$^2$) | Efficiency (lm/W) |
|---|---|---|---|---|---|---|
| 6 | 103 | 202 | 10:90 | 4.0 | 1510 | 9.9 |
| 7 | 108 | 201 | 15:85 | 4.0 | 1520 | 10.8 |
| 8 | 106 | 201 | 20:80 | 4.0 | 1330 | 10.4 |
| 9 | 107 | 201 | 15:85 | 4.0 | 1480 | 10.6 |
| 10 | 119 | 307 | 15:85 | 4.0 | 1530 | 10.0 |
| 11 | 132 | 402 | 15:85 | 4.0 | 1570 | 11.2 |
| 12 | 102 | 434 | 10:90 | 4.0 | 1360 | 10.7 |
| 13 | 128 | 407 | 15:85 | 4.0 | 1420 | 10.2 |
| 14 | 113 | 450 | 15:85 | 4.0 | 1530 | 10.0 |
| 15 | 108 | 514 | 10:90 | 4.0 | 1490 | 9.8 |
| 16 | 133 | 512 | 15:85 | 4.0 | 1450 | 10.3 |

COMPARATIVE EXAMPLE 2

A light-emitting device was produced in the same manner as in Example 9 except that Comparative Compound-1 was used as the first compound instead of Exemplified Compound No. 107; and a co-deposition ratio was changed to 20:80 (weight ratio). The device was evaluated in the same manner as in Example 9.

Under application of a voltage of 4 V, green light emission with an emission luminance of 580 cd/m$^2$ and a luminous efficiency of 2.5 lm/W was observed. Further, when the voltage was applied to the device for 100 hours while a current density was maintained at 30 mA/cm$^2$ under a nitrogen atmosphere, a luminance change from an initial luminance of 890 cd/m$^2$ to a luminance of 420 cd/m$^2$ after 100 hours was observed.

The silyl compound of the present invention in which a silyl group is directly bonded to an anthracene ring can be utilized in an organic light-emitting device because the incorporation of the compound particularly into a light-emitting layer can provide highly efficient light emission.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-056957, filed Mar. 2, 2006, which is hereby incorporated by reference herein in its entirety.

What is claimed is:

1. An organic light-emitting device, comprising:
   a pair of electrodes composed of an anode and a cathode; and
   a light-emitting organic compound layer interposed between the pair of electrodes,
   wherein the light-emitting organic compound layer contains a light-emitting compound represented by the following general formula [1]:

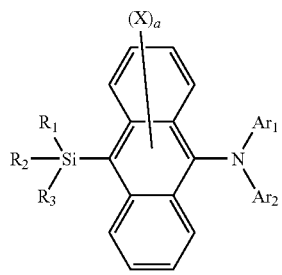

[1]

where Ar$_1$ and Ar$_2$ each represent a group selected from the group consisting of a substituted or unsubstituted alkyl group, a substituted or unsubstituted aralkyl group, a substituted or unsubstituted aryl group, and a substituted or unsubstituted heterocyclic group, Ar$_1$ and Ar$_2$ may be the same or different from each other, and Ar$_1$ and Ar$_2$ may be bonded to each other to form a ring, R$_1$, R$_2$, and R$_3$ each represent a group selected from the group consisting of a hydrogen atom, a halogen atom, a substituted or unsubstituted alkyl group, a substituted or unsubstituted aralkyl group, a substituted or unsubstituted aryl group, and a substituted or unsubstituted heterocyclic group, and R$_1$, R$_2$, and R$_3$ may be the same or different from one another, X represents a group selected from the group consisting of a halogen atom, a substituted or unsubstituted alkyl group, a substituted or unsubstituted aralkyl group, a substituted or unsubstituted alkenyl group, a substituted or unsubstituted alkynyl group, a substituted or unsubstituted alkoxy group, a substituted or unsubstituted sulfide group, a substituted or unsubstituted silyl group, a substituted or unsubstituted amino group, a substituted or unsubstituted aryl group, and a substituted or unsubstituted heterocyclic group, and X's may be the same or different from each other, and a represents an integer of 0 or more to 8 or less.

2. An organic light-emitting device according to claim 1, wherein the light-emitting layer contains a first compound represented by the general formula [1] and a second compound represented by the following general formula [2]:

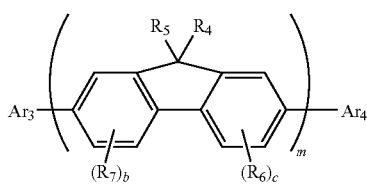

[2]

where $R_4$ and $R_5$ each represent a hydrogen atom, a substituted or unsubstituted alkyl group, a substituted or unsubstituted aralkyl group, a substituted or unsubstituted aryl group, or a substituted or unsubstituted heterocyclic group, and $R_4$ and $R_5$ may be the same or different from each other, $R_6$ and $R_7$ each represent a substituted or unsubstituted alkyl group, a substituted or unsubstituted aralkyl group, a substituted or unsubstituted aryl group, a substituted or unsubstituted heterocyclic group, a substituted amino group, a cyano group, or a halogen atom, $R_6$ and $R_7$ may be the same or different from each other, and $R_6$'s or $R_7$'s may be the same or different from each other, $Ar_3$ and $Ar_4$ each represent a substituted or unsubstituted aryl group, or a substituted or unsubstituted heterocyclic group, and $Ar_3$ and $Ar_4$ may be the same or different from each other, m represents an integer of 1 or more to 10 or less, and b and c each represent an integer of 0 or more to 3 or less.

3. An organic light-emitting device according to claim 1, wherein the light-emitting layer contains a first compound represented by the general formula [1] and a second compound represented by the following general formula [3]:

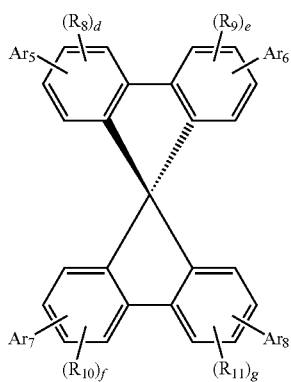

[3]

where $R_8$ to $R_{11}$ each represent a substituted or unsubstituted alkyl group, a substituted or unsubstituted aralkyl group, a substituted or unsubstituted aryl group, a substituted or unsubstituted heterocyclic group, a substituted amino group, a cyano group, or a halogen atom, $R_8$ to $R_{11}$ may be the same or different from one another, and $R_8$'s, $R_9$'s, $R_{10}$'s, or $R_{11}$'s may be the same or different from each other, $Ar_5$ to $Ar_8$ each represent a substituted or unsubstituted aryl group, or a substituted or unsubstituted heterocyclic group, and $Ar_5$ to $Ar_8$ may be the same or different from one another, and d, e, f, and g each represent an integer of 0 or more to 3 or less.

4. An organic light-emitting device according to claim 1, wherein the light-emitting layer contains a first compound represented by the general formula [1] and a second compound represented by the following general formula [4]:

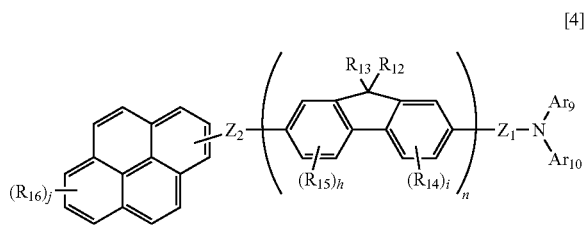

[4]

where $R_{12}$ and $R_{13}$ each represent a hydrogen atom, a substituted or unsubstituted alkyl group, a substituted or unsubstituted aralkyl group, a substituted or unsubstituted aryl group, or a substituted or unsubstituted heterocyclic group, and $R_{12}$ and $R_{13}$ may be the same or different from each other, $R_{14}$ and $R_{15}$ each represent a substituted or unsubstituted alkyl group, a substituted or unsubstituted aralkyl group, a substituted or unsubstituted aryl group, a substituted or unsubstituted heterocyclic group, a substituted amino group, a cyano group, or a halogen atom, $R_{14}$ and $R_{15}$ may be the same or different from each other, and $R_{14}$'s or $R_{15}$'s may be the same or different from each other, $R_{16}$ represents a substituted or unsubstituted alkyl group, a substituted or unsubstituted aralkyl group, a substituted or unsubstituted aryl group, or a substituted or unsubstituted heterocyclic group, and $R_{16}$'s may be the same or different from each other, $Z_1$ and $Z_2$ each represent a group selected from the group consisting of a direct single bond, a substituted or unsubstituted alkylene group, a substituted or unsubstituted alkenylene group, a substituted or unsubstituted alkynylene group, a substituted or unsubstituted aralkylene group, a substituted or unsubstituted arylene group, a substituted or unsubstituted divalent heterocyclic group, a substituted or unsubstituted silyl group, an ether group, a thioether group, and a carbonyl group, and each of $Z_1$ and $Z_2$ may further have a linking group, $Ar_9$ and $Ar_{10}$ each represent a substituted or unsubstituted aryl group, or a substituted or unsubstituted heterocyclic group, $Ar_9$ and $Ar_{10}$ may be the same or different from each other, and $Ar_9$ and $Ar_{10}$ may form a ring, n represents an integer of 1 or more to 10 or less, h and i each represent an integer of 0 or more to 3 or less, and j represents an integer of 0 or more to 9 or less.

5. An organic light-emitting device according to claim 1, wherein the light-emitting layer contains a first compound represented by the general formula [1] and a second compound represented by the following general formula [5]:

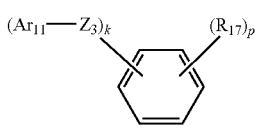

[5]

where $Ar_{11}$ represents a group selected from the group consisting of a substituted or unsubstituted aralkyl group, a substituted or unsubstituted aryl group, and a substituted or unsubstituted heterocyclic group, and, when k represents 2 or more, $Ar_{11}$'s may be the same or different from each other, $Z_3$ represents a group selected from the group consisting of a direct single bond, a substituted or unsubstituted alkylene group, a substituted or unsubstituted alkenylene group, a substituted or unsubstituted alkynylene group, a substituted or unsubstituted aralkylene group, a substituted or unsubstituted arylene group, a substituted or unsubstituted divalent heterocyclic group, a substituted or unsubstituted silyl group, an ether group, a thioether group, and a carbonyl group, $Z_3$ may further have a linking group, and, when k represents 2 or more, $Z_3$'s may be the same or different from each other, $R_{17}$ represents a group selected from the group consisting of a halogen atom, a substituted or unsubstituted alkyl group, a substituted or unsubstituted alkoxy group, a substituted or unsubstituted sulfide group, a substituted or unsubstituted amino group, and a substituted or unsubstituted silyl group, and, when p represents 2 or more, $R_{17}$'s may be the same or different from each other, k represents an integer of 1 or more to 6 or less, and p represents an integer of 0 or more to 5 or less provided that a relationship of $k+p \leq 6$ is satisfied.

* * * * *